US008188529B2

(12) United States Patent
Nakamura et al.

(10) Patent No.: US 8,188,529 B2
(45) Date of Patent: May 29, 2012

(54) SEMICONDUCTOR DEVICE AND METHOD FOR MANUFACTURING THE SAME

(75) Inventors: Yoshitaka Nakamura, Tokyo (JP); Kenji Komeda, Tokyo (JP); Ryota Suewaka, Tokyo (JP); Noriaki Ikeda, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 447 days.

(21) Appl. No.: 12/318,735

(22) Filed: Jan. 7, 2009

(65) Prior Publication Data

US 2009/0179246 A1 Jul. 16, 2009

(30) Foreign Application Priority Data

Jan. 10, 2008 (JP) ................................ 2008-003284

(51) Int. Cl.
*H01L 27/108* (2006.01)
(52) U.S. Cl. ................................ 257/306; 257/E27.086
(58) Field of Classification Search .................. 257/213, 257/288, 296–313, E27.084, E27.085, E27.086
See application file for complete search history.

(56) References Cited

U.S. PATENT DOCUMENTS

| 5,279,983 | A | 1/1994 | Ahn |
| 5,386,382 | A | 1/1995 | Ahn |
| 6,756,262 | B1 * | 6/2004 | Nakamura et al. ............ 438/240 |
| 7,026,208 | B2 | 4/2006 | Park et al. |
| 2003/0178728 | A1 * | 9/2003 | Park et al. ...................... 257/758 |

FOREIGN PATENT DOCUMENTS

| JP | 07-007084 | 1/1995 |
| JP | 11-026713 | 1/1999 |
| JP | 2002-009259 A | 1/2002 |
| JP | 2003-297952 A | 10/2003 |

* cited by examiner

*Primary Examiner* — Ha Tran T Nguyen
*Assistant Examiner* — Kevin Quinto
(74) *Attorney, Agent, or Firm* — Foley & Lardner LLP

(57) ABSTRACT

A semiconductor device comprises a memory cell region, a peripheral circuit region and a boundary region. In the memory cell region, a concave lower electrode and a foundation layer have a same uppermost surface positioned in a height of H above the plane-A. In the boundary region, one concave lower conductive region and a foundation layer have a same uppermost surface positioned in a height of H above the plane-A.

17 Claims, 31 Drawing Sheets

SEMICONDUCTOR DEVICE AND METHOD FOR MANUFACTURING THE SAME

This application is based upon and claims the benefit of priority from Japanese Patent Application No. 2008-003284, filed on Jan. 10, 2008, the disclosure of which is incorporated herein in its entirety by reference.

BACKGROUND OF THE INVENTION

1. Field of the Invention

The present invention relates to a semiconductor device which includes a memory cell region, a peripheral circuit region, and a boundary region in a boundary between the memory cell region and the peripheral circuit region and in which no step difference is formed in the boundary, and to a method for manufacturing the semiconductor device.

2. Description of the Related Art

A memory device, such as a DRAM (Dynamic Random Access Memory), generally comprises a memory cell region for storing information, a peripheral circuit region for controlling the writing/reading of information to this memory cell region, and a boundary region present between the memory cell region and the peripheral circuit region.

This memory cell region generally comprises a plurality of memory cells, each of which comprises a select transistor and a capacitor. In recent years, this memory device has had the problem of a decrease in the amount of charge accumulated in the capacitor as a result of the memory cells being miniaturized due to the development of microfabrication technique.

Hence, a crown-structured capacitor has been adopted in order to solve this problem. This crown-structured capacitor is constructed in such a manner that a lower electrode, a dielectric film and an upper electrode are formed within a concavely-formed opening so as to extend along the inner wall thereof, thereby increasing the area of the capacitor. Japanese Patent Laid-Open No. 7-7084 discloses a semiconductor device with this crown-structured capacitor and a method for manufacturing the semiconductor device.

When forming this crown-structured capacitor, it is important to eliminate a step difference present in a boundary between the memory cell region and the peripheral circuit region, from the viewpoint of making a process in a later interconnection step easy.

Hence, in the method disclosed in Japanese Patent Laid-Open No. 7-7084, several rows of trenches comprised of lower electrodes are formed in the boundary region between the memory cell region and the peripheral circuit region and an interlayer insulating film in the memory cell region is removed by wet etching, with at least one trench and the peripheral circuit region covered with a photoresist film.

FIGS. 20 to 31 illustrate a method for manufacturing such a related semiconductor device as shown by way of example in Japanese Patent Laid-Open No. 7-7084. First, gate oxide film 3, gate electrode 4, diffusion layer regions (source/drain regions) 5, 6, 7 and 7a, polysilicon plugs 11 and 11a, metal plugs 12, 41, 41a, 42 and 42a, bit line 8, first layer interconnects 8a and 8b, landing pad 81, lower layers 81c (two layers parallel to each other), and the like are formed on a substrate constituting the memory cell region and the peripheral circuit region. FIG. 20 is a cross-sectional view illustrating this condition, whereas FIG. 21 is a top view illustrating the upper portion of the memory cell region after the patterning of landing pad 81 and lower layers 81c.

Next, interlayer insulating film (silicon nitride film) 32 and interlayer insulating film (oxide silicon film) 24 are successively formed on the entire surface of the resulting structure. FIG. 22 is a cross-sectional view illustrating this condition. After this, cylinder hole 91 is created using a photolithographic technique and a dry etching technique, so as to penetrate through interlayer insulating films 24 and 32, thereby exposing a surface of landing pad 81 on the bottom face of cylinder hole 91. At this time, cylinder trench 91a is created in a boundary region concurrently with creating cylinder hole 91, thereby exposing lower layer 81c on the bottom of cylinder trench 91a. FIG. 23 is a cross-sectional view illustrating this condition, whereas FIG. 24 is a top view illustrating an edge of the memory cell region after the patterning of cylinder hole 91 and cylinder trench 91a.

Next, using a CVD method, first titanium nitride film 51 is grown on the entire surface of the resulting structure. Next, a photoresist film (not illustrated) is filled into cylinder hole 91 and cylinder trench 91a, and then a portion of the first titanium nitride film located upper than interlayer insulating film 24 is etched back and removed. Consequently, it is possible to obtain concave lower electrode 51 on the inner wall of cylinder hole 91 in the memory cell region and concave lower conductive region 51a on the inner wall of cylinder hole 91a in the boundary region. Next, the photoresist film is removed using an organic separating liquid. FIG. 25 is a cross-sectional view illustrating this condition, whereas FIG. 26 is a top view illustrating an edge of the memory cell region after the etching back of the titanium nitride film.

Next, using a photolithographic technique, photoresist film 96 is formed in the peripheral circuit (logic circuit) region and in part of the boundary region. At this time, alignment is performed so that at least one of two parallel lower conductive regions 51a in the boundary region is covered with the photoresist film. FIG. 27 is a cross-sectional view illustrating this condition, whereas FIG. 28 is a top view illustrating an edge of the memory cell region after the formation of photoresist film 96.

The reason for two lower conductive regions 51a being formed in this way is that, as shown in Japanese Patent Laid-Open No. 7-7084, the photoresist film is formed so that an edge thereof is shifted toward the peripheral circuit region side in some cases due to misalignment. That is, the two lower conductive regions are formed in order to prevent any portions, in which the photoresist film is not present, from being formed on the peripheral circuit (logic circuit) region, thereby preventing interlayer insulating film 24 in the peripheral circuit (logic circuit) region from being eroded by later wet etching.

Next, a portion of interlayer insulating film (oxide silicon film) 24 in the memory cell region is removed by a wet etching method using a dilute hydrofluoric acid (HF) solution. At this time, photoresist film 96 serves as a mask in the peripheral circuit region (logic circuit region) and, therefore, interlayer insulating film (oxide silicon film) 24 remains without being removed. FIG. 29 is a cross-sectional view illustrating this condition, whereas FIG. 30 is a top view illustrating an edge of the memory cell region after the removal of interlayer insulating film 24.

Next, dielectric film 52, upper electrode (second titanium nitride) 53, second layer interconnects 61 and 61a, and the like are formed, thereby finally obtaining the semiconductor device. FIG. 31 is a cross-sectional view illustrating this condition.

We have now discovered that there are the below-mentioned problems with such a semiconductor device and a method for manufacturing the semiconductor device as shown by way of example in FIGS. 21 to 30 mentioned above:

(1) The area of the boundary region becomes large due to the presence of two lower conductive regions (cylinder trenches arranged around the memory cell region). As a result, the chip area also becomes large and, therefore, the cost of manufacture increases.

(2) Since a photoresist film is used as a mask for the peripheral circuit (logic circuit) region when removing portions of the interlayer insulating film in the memory cell region and the boundary region by a wet etching method, foreign matter is produced during wet etching. That is, the photoresist film reacts with a dilute hydrofluoric acid (HF) solution at the time of wet etching and changes in quality, thus producing polymer-like foreign matter. Alternatively, watermarks or the like is produced since IPA (isopropyl alcohol) cannot be used when drying a wafer after wet etching. Consequently, the yield of manufacture degrades.

(3) A lower electrode collapses or adjacent lower electrodes come into contact with each other due to the absence of a foundation layer in the memory cell region. In particular, the lower electrode becomes easy to collapse due to surface tension produced during wet etching with a lower electrode exposed. Consequently, the yield of manufacture degrades.

Accordingly, the present inventors have recognized that it is possible to solve problems (1) to (3) mentioned above by forming a silicon nitride film which serves as a mask for the peripheral circuit (logic circuit) region and as a foundation layer in the memory cell region at the time of wet etching.

SUMMARY OF THE INVENTION

The present invention seeks to solve one or more of the above problems, or to improve upon those problems at least in part.

In one embodiment, there is provided a semiconductor device, comprising:
a memory cell region;
a peripheral circuit region;
a boundary region formed in a boundary between the memory cell region and the peripheral circuit region; and
an interlayer insulating film formed across the peripheral circuit region and the boundary region,
wherein the memory cell region comprises:
a concave lower electrode formed so as to extend upwardly from below plane-A having level equal to an upper surface of the interlayer insulating film and protruding by a height of H above the plane-A; and
a foundation layer having a thickness of H formed at least in part on the plane-A other than the part thereof taken up by the lower electrode,
the boundary region comprises:
one concave lower conductive region formed so as to extend upwardly from below plane-A having level equal to the upper surface of the interlayer insulating film and protruding by a height of H above the plane-A; and
the foundation layer having a thickness of H formed on the upper surface of the interlayer insulating film, and
the memory cell region and the boundary region comprise:
a dielectric film formed so as to cover surfaces of the lower electrode, the lower conductive region and the foundation layer; and
an upper conductive region including a conductive layer formed so as to have contact with an uppermost surface of a portion of the dielectric film over the plane-A and the interlayer insulating film, and a convex portion branching off from the conductive layer and disposed facing to the lower electrode and the lower conductive region with an intervention of the dielectric film therebetween.

In another embodiment, there is provided a semiconductor device, comprising:
a memory cell region comprising:
a first capacitor with a crown structure;
a second capacitor with a crown structure having the same uppermost surface as the first capacitor; and
a first foundation layer formed between the first capacitor and the second capacitor so as to have the same uppermost surface as the first and second capacitors,
a peripheral circuit region formed surrounding the memory cell region, and
a boundary region formed between the memory cell region and the peripheral circuit region, comprising:
a dummy capacitor disposed so as to surround the memory cell region, and formed so as to have the same uppermost surface as the first and second capacitors; and
a second foundation layer formed between the capacitor positioned in a boundary region side among the first and the second capacitors and the dummy capacitor, so as to have the same uppermost level as the first and second capacitors.

In another embodiment, there is provided a method for manufacturing a semiconductor device including a memory cell region, a peripheral circuit region, and a boundary region formed in a boundary between the memory cell region and the peripheral circuit region, the method comprising:
(1) forming an interlayer insulating film across the memory cell region, the peripheral circuit region, and the boundary region;
(2) forming a foundation layer having a thickness of H on the entire surface of the interlayer insulating film;
(3) forming an opening extending within the foundation layer and the interlayer insulating film of the memory cell region in a thickness direction thereof, and one opening extending within the foundation layer and the interlayer insulating film of the boundary region in the thickness direction thereof;
(4) forming a concave lower electrode on an inner wall of the opening in the memory cell region and a concave lower conductive region on an inner wall of the opening in the boundary region;
(5) performing isotropic etching using the foundation layer, the lower electrode and the lower conductive region as masks and etching stoppers, to remove portions of the interlayer insulating film within the memory cell region and the boundary region;
(6) forming a dielectric film so as to cover the memory cell region, the peripheral circuit region, and the boundary region;
(7) depositing a conductive material on the memory cell region, the peripheral circuit region and the boundary region, and forming a conductive film disposed facing to the lower electrode and the lower conductive region with an intervention of the dielectric film therebetween; and
(8) removing portions of the foundation layer, the dielectric film and the conductive film on the interlayer insulating film of the peripheral circuit region.

BRIEF DESCRIPTION OF THE DRAWINGS

The above features and advantages of the present invention will be more apparent from the following description of certain preferred embodiments taken in conjunction with the accompanying drawings, in which.

Figure 1:
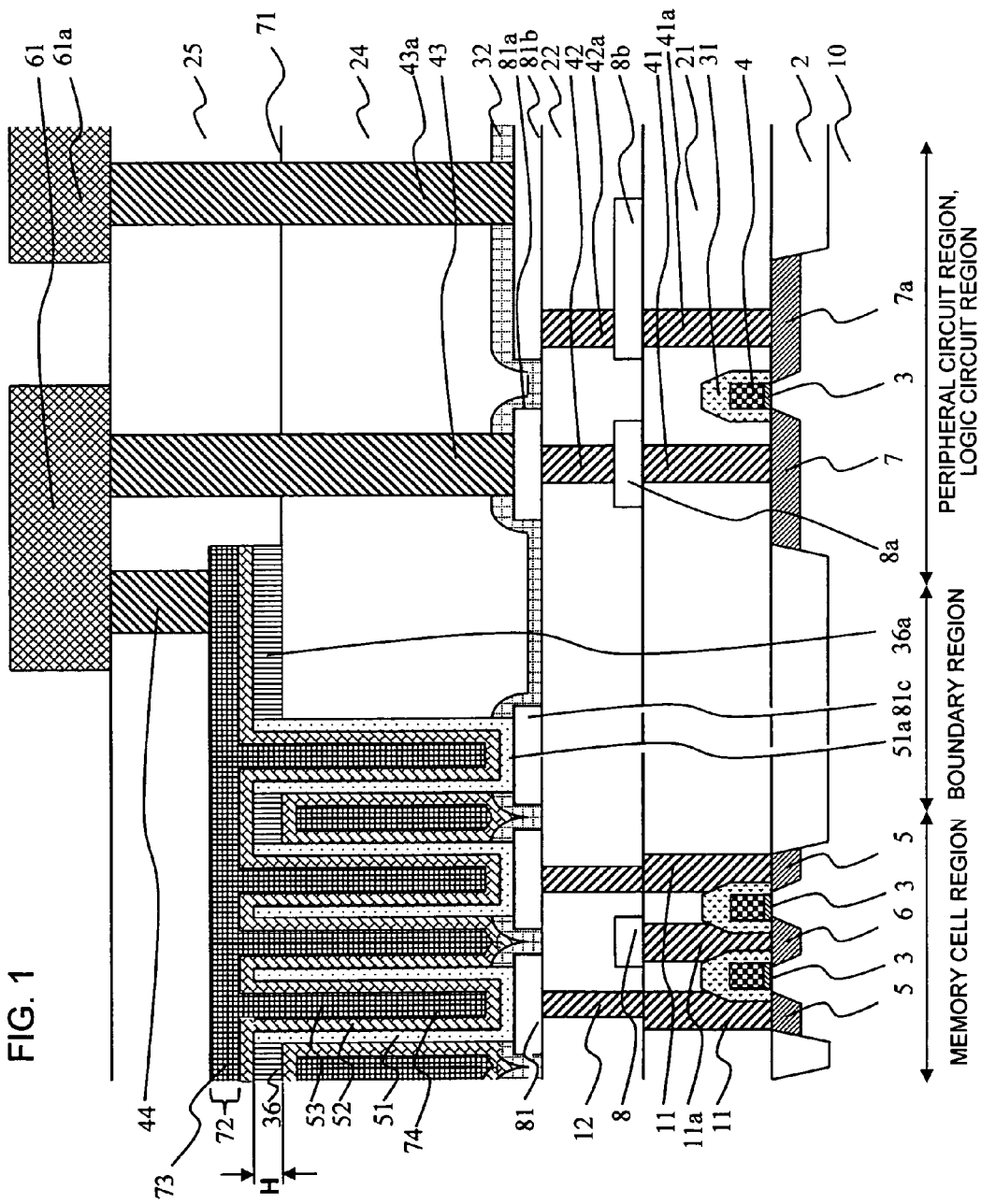
FIG. 1 is a schematic view illustrating one example of a semiconductor device of the present invention.

In the drawings, numerals have the following meanings. 3: gate insulating film, 4: gate electrode, 5, 6, 7, 7a: impurity-diffused region (source/drain region), 8, 8a, 8b, 8c: first layer interconnect, 10: silicon semiconductor substrate, 11, 11a: contact plug, 12, 41, 41a, 42, 42a, 43, 43a, 44: metal plug, 21, 22, 25, 26, 36: interlayer insulating film, 24: interlayer insulating film (oxide silicon film), 32: interlayer insulating film (silicon nitride film), 51: lower electrode, 51a: lower conductive region, 52: dielectric film, 53: upper electrode, 61, 61a: second layer interconnect, 71: upper surface of interlayer insulating film, 72: conductive layer, 73: uppermost surface of dielectric film, 74: convex portion, 81: landing pad, 81a, 81b: local interconnect, 91: cylinder hole, 91a: cylinder trench, 96: photoresist film.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

1. Semiconductor Device

A semiconductor device comprises a memory cell region, a peripheral circuit region, and a boundary region formed between the memory cell region and the peripheral circuit region. In addition, an interlayer insulating film is formed across the peripheral circuit region and the boundary region. Typically, the interlayer insulating film is formed in part in the boundary region.

This memory cell region includes a concave lower electrode and a foundation layer having a thickness of H. This concave lower electrode is formed so as to extend upwardly from below plane-A having level equal to the upper surface of the interlayer insulating film and protrudes by a height of H above plane-A. In addition, the foundation layer having a thickness of H is formed at least in part on plane-A other than the part thereof taken up by the lower electrode. In this memory cell region, only the lower electrode and the foundation layer may be formed on plane-A, or other layers or regions may be formed thereon in addition to the lower electrode and the foundation layer. For example, in the memory cell region of FIG. 1, there are formed a dielectric film and an upper conductive region on part of plane-A between adjacent lower electrodes.

In addition, the boundary region includes one concave lower conductive region and a foundation layer having a thickness of H. This concave lower conductive region is formed so as to extend upwardly from below plane-A having level equal to the upper surface of the interlayer insulating film, and protrudes by a height of H above plane-A. The foundation layer having a thickness of H is formed on the upper surface of a portion of the interlayer insulating film present in the boundary region. That is, the concave lower conductive region and the foundation layer having a thickness of H exist respectively on plane-A and on the upper surface of the interlayer insulating film in the boundary region.

Consequently, all of the uppermost surface of the lower electrode, the uppermost surface of the lower conductive region, and the uppermost surface of the foundation layer are located at a height of H from plane-A and the upper surface of the interlayer insulating film within the memory cell region and the boundary region, thereby constituting one level plane.

If another interlayer insulating film is formed above the concave lower conductive region and the concave lower electrode, "interlayer insulating film" as described in the claims of the present invention denotes an insulating layer in which the above-described foundation layer is formed. Therefore, the surface of the insulating layer with which the above-described foundation layer has contact corresponds to the "upper surface of the interlayer insulating film" described in the claims. In addition, "plane-A" denotes a plane conceived as having level equal to the upper surface of this interlayer insulating film in the memory cell region and the boundary region. This means that the concave lower conductive region and the concave lower electrode protrude upwardly by a height of H from this plane-A.

Since only one concave lower conductive region suffices in this boundary region, it is possible to miniaturize the boundary region. In the boundary region of the present invention, "one concave lower conductive region" denotes a conductive region comprised of one continuous concave structure. The shape of this lower conductive region is not limited in particular, as long as the lower conductive region is one continuous concave structure. Preferably, however, the concave structure is formed so as to surround the memory cell region in one trip therearound.

In the memory cell region and the boundary region, a dielectric film is formed so as to cover the entire surfaces of the concave lower electrode, the concave lower conductive region and the foundation layer. The thickness of the dielectric film and the diameters of the lower electrode and the lower conductive region are adjusted so that the concave lower electrode and the concave lower conductive region are not completely filled with the dielectric film. In addition, the uppermost surface of the lower electrode, the uppermost surface of the lower conductive region and the uppermost surface of the foundation layer altogether constitute one level plane within the memory cell region and the boundary region, and the thickness of the dielectric film is constant. This means that the uppermost surfaces of the dielectric film on the upper surface of the interlayer insulating film and on plane-A altogether constitute one level plane.

Furthermore, an upper conductive region is formed on the entire surfaces of the memory cell region and the boundary region, so as to have contact with the dielectric film. This upper conductive region includes a laminated conductive layer having a predetermined thickness and formed on the entire surface of the dielectric film so as to have contact with the uppermost surface thereof, and a convex portion branching off from this conductive layer and filled into the concave lower electrode and the concave lower conductive region covered with the dielectric film.

This laminated conductive layer is formed so as to have contact with the uppermost surface of the dielectric film, and the uppermost surface of this dielectric film is level across the memory cell region and the boundary region. Consequently, in the present invention, it is possible to level the uppermost surface of the conductive layer of this upper conductive region in the memory cell region and the boundary region, thereby constituting the uppermost surface of the conductive layer as a level plane.

As described above, in the semiconductor device of the present invention, it is possible to level the uppermost surface of the conductive layer of the upper conductive region in the memory cell region and the boundary region. Consequently, even if an interlayer insulating film is formed on the entire surfaces of the memory cell region, the boundary region and the peripheral circuit (logic circuit) region or even if an interconnect layer is formed on this interlayer insulating film, it is possible to eliminate step differences among these regions and planarize the interlayer insulating film and the interconnect layer.

When forming a foundation layer on the upper surface of the interlayer insulating film and on plane-A in the memory cell region and the boundary region in the course of manufacturing this semiconductor device, the foundation layer, which functions as a mask at the time of wet etching, is formed simultaneously also on the interlayer insulating film of the peripheral circuit (logic circuit) region (this interlayer insulating film is removed and is, therefore, not present in a finished semiconductor device). In addition, a portion of the foundation layer located upper than the interlayer insulating film of this peripheral circuit (logic circuit) region still remains when portions of the interlayer insulating film in the memory cell region and the boundary region are removed by wet etching. Since the foundation layer in this peripheral circuit (logic circuit) region therefore serves as a mask at the time of wet etching, there is no need to newly form a photoresist film to serve as a mask in the peripheral circuit (logic circuit) region. As a result, there is no need to form, within the boundary region, a margin for alignment to be carried out between the photoresist film and the peripheral circuit (logic circuit) region. Thus, it is possible to miniaturize the boundary region. As a result, foreign matter attributable to the use of the photoresist film is not produced at the time of wet etching. Thus, it is possible to improve a yield at the time of manufacture.

Furthermore, a mechanically high-strength foundation layer is formed on a portion of plane-A between adjacent lower electrodes in the memory cell region. Consequently, the lower electrodes in the memory cell region do not collapse and the adjacent lower electrodes do not come into contact with each other. In particular, there arises no such a problem as the collapse of the lower electrodes due to surface tension produced during wet etching with the lower electrodes exposed. As a result, it is possible to improve a yield at the time of manufacture.

2. Method for Manufacturing Semiconductor Device

In a manufacturing method, a foundation layer having a thickness of H is formed on the entire surface of the interlayer insulating film in one step. In another step, there is formed an opening extending within portions of the interlayer insulating film and the foundation layer in the memory cell region and the boundary region in the thickness direction thereof. Then, a concave lower electrode is formed on the inner wall of an opening in the memory cell region, and a concave lower conductive region is formed on the inner wall of an opening in the boundary region. Consequently, all of the uppermost surface of the lower electrode, the uppermost surface of the lower conductive region, and the uppermost surface of the foundation layer on plane-A and on the interlayer insulating film are located at a height of H upward from plane-A and the interlayer insulating film within the memory cell region and the boundary region, thereby constituting one level plane.

Next, isotropic etching is performed using the foundation layer, the lower electrode and the lower conductive region as masks and etching stoppers, thereby removing portions of the interlayer insulating film in the memory cell region and in part of the boundary region. At this time, a portion of the foundation layer on the interlayer insulating film of the peripheral circuit (logic circuit) region remains. Consequently, the foundation layer in this peripheral circuit (logic circuit) region serves as a mask at the time of wet etching in this step. In addition, the lower electrode and the lower conductive region serve as etching stoppers at the time of wet etching. Accordingly, there is no need to newly form a photoresist film in the peripheral circuit (logic circuit) region as a mask. In addition, the lower electrode and the lower conductive region remain as they are without being removed by wet etching.

As a result, there is no need to form a margin for alignment to be carried out between the photoresist film and the peripheral circuit (logic circuit) region within the boundary region. Thus, it is possible to miniaturize the boundary region. Furthermore, there arises no such a problem at the time of wet etching that the photoresist film reacts with a dilute hydrofluoric acid (HF) solution and changes in quality, thus producing polymer-like foreign matter, or watermarks or the like is produced when drying a wafer after wet etching. Consequently, it is possible to improve a yield at the time of manufacture.

Next, a dielectric film having a predetermined thickness is formed so as to cover the entire surfaces of the memory cell region, the peripheral circuit region and the boundary region. In addition, a conductive material is deposited on the entire surfaces of the memory cell region, the peripheral circuit region and the boundary region, and filled into the concave lower electrode and the concave lower conductive region covered with the dielectric film, thereby forming a convex portion. Concurrently with this step, a laminated conductive layer having a predetermined thickness is formed so as to have contact with the uppermost surface of the dielectric film. This laminated conductive layer is formed so as to have contact with the uppermost surface of the dielectric film, and the uppermost surface of this dielectric film is level across the memory cell region and the boundary region. Consequently, in the present invention, it is possible to level the uppermost surface of the conductive layer of this upper conductive region in the memory cell region and the boundary region, thereby constituting the uppermost surface of the conductive layer as a level plane.

As described above, in the semiconductor device of the present invention, it is possible to level the uppermost surface of the conductive layer of the upper conductive region in the memory cell region and the boundary region. Consequently, even if an interlayer insulating film is formed on the entire surfaces of the memory cell region, the boundary region and the peripheral circuit (logic circuit) region or even if an interconnect layer is formed on this interlayer insulating film, it is possible to eliminate step differences among these regions and planarize the interlayer insulating film and the interconnect layer.

Furthermore, a mechanically high-strength foundation layer is formed between adjacent lower electrodes in the memory cell region. Consequently, the lower electrodes in the memory cell region do not collapse and the adjacent lower electrodes do not come into contact with each other. In particular, there arises no such a problem as the collapse of the lower electrodes due to surface tension produced during wet etching with the lower electrodes exposed. As a result, it is possible to improve a yield at the time of manufacture.

Hereinafter, the present invention will be described by referring to exemplary embodiments. However, the present invention is not limited to the below-described exemplary embodiments. Rather, various modifications understandable to a person skilled in the art may be made to the configuration and specifics of the present invention within the technical scope thereof.

(First Exemplary Embodiment)
Semiconductor Device

Next, a semiconductor device according to a first exemplary embodiment will be described in detail with reference to the accompanying drawings. FIG. 1 is a vertical cross-sectional view illustrating the semiconductor device of the first exemplary embodiment. This semiconductor device is comprised of a memory cell region for storing information, a peripheral circuit region for controlling the writing/reading of information to/from this memory cell region, and a boundary region present between the memory cell region and the peripheral circuit region. Thus, the semiconductor device as a whole constitutes a memory device.

First, an explanation will be made of the memory cell region and the boundary region. In the memory cell region of FIG. 1, two gate electrodes 4 are formed, by way of gate insulating film 3, on the principal surface of an active region defined by isolation insulating film 2 in the principal surface of silicon semiconductor substrate 10. In addition, a pair of impurity-diffused regions 5 and 6 (first and second impurity-diffused regions) to serve as a source region and a drain region are formed on one and the other sides of gate electrode 4 within silicon semiconductor substrate 10. One select transistor (field-effect transistor) is comprised of one gate electrode 4, one layer of gate insulating film 3, and a pair of impurity-diffused regions 5 and 6. In FIG. 1, two select transistors are shown within the memory cell region. In addition, impurity-diffused region 6 (first impurity-diffused region) of the respective select transistors is shared by the transistors as one common impurity-diffused region. Only two select transistors (field-effect transistors) are shown in the memory cell region of FIG. 1. Typically however, three or more select transistors are formed in the memory cell region.

Impurity-diffused region 6 (first impurity-diffused region) of this select transistor is electrically connected to bit line 8 (tungsten (W) film) formed on interlayer insulating film 21 by way of polysilicon plug 11 a penetrating through interlayer insulating film 21. This bit line 8 is covered with interlayer insulating film 22.

On this interlayer insulating film 22, there are laminated lower electrode 51 made of a first titanium nitride film, dielectric film 52 made of a laminated film composed of an aluminum oxide film (3 nm-thick) and a hafnium oxide film (4 nm-thick), and upper electrode 53 (15 nm-thick) made of a second titanium nitride film, thereby forming a capacitor. In addition, foundation layer 36 is formed above interlayer insulating film 22.

In the semiconductor device of FIG. 1, "interlayer insulating film" as described in the appended claims refers to interlayer insulating film 24 and the upper surface thereof is denoted by reference numeral 71. Lower electrode 51 in the memory cell region is formed so as to extend upwardly from below plane-A having level equal to upper surface 71 of the interlayer insulating film, and protrudes by a height of H above this plane-A. In addition, foundation layer 36 is formed on plane-A so as to have a thickness of H. Lower conductive region 51a in the boundary region is formed upwardly from below plane-A having level equal to upper surface 71 of the interlayer insulating film, and protrudes by a height of H above plane-A. Foundation layer 36 is formed on interlayer insulating film 24 so as to have a thickness of H. In addition, another foundation layer 36a is formed on this interlayer insulating film 24.

In the memory cell region and the boundary region, foundation layers 36 and 36a are formed on plane-A and on interlayer insulating film 24, and dielectric film 52 is formed so as to have contact with these foundation layers 36 and 36a. In addition, conductive layer 72 of upper conductive region 53 is formed so as to have contact with uppermost surface 73 of this dielectric film 52. The upper conductive region 53 is disposed facing to the lower electrode 51 and the lower conductive region 51a with an intervention of the dielectric film 52 therebetween. Convex portion 74 of upper conductive region 53 is formed within lower electrode 51 and lower conductive region 51a.

Lower electrode 51 is concave and the bottom face thereof is electrically connected to metal plug 12 by way of landing pad 81 made of a laminated film composed of a tungsten film and a tungsten nitride film. This metal plug 12 is, in turn, electrically connected to impurity-diffused region 5 (second impurity-diffused region) of the select transistor by way of polysilicon plug 11 located below the metal plug. This metal plug 12 and polysilicon plug 11 constitute a first contact plug. The lower conductive region 51a, the dielectric film 52 and the upper conductive region at the boundary region operates as a dummy capacitor.

In the semiconductor device of FIG. 1, one memory cell is comprised of one field-effect transistor, one first contact plug, and one capacitor. In the memory cell region of FIG. 1, there are shown two memory cells. This memory cell region of FIG. 1 constitutes a DRAM (Dynamic Random Access Memory).

Second interlayer insulating film 25 is formed on second titanium nitride film 53 of the upper electrode. On this second interlayer insulating film 25, there is formed second layer interconnect 61. This upper electrode 53 and second layer interconnect 61 are electrically connected to each other by way of connecting plug 44 (second contact plug) penetrating through interlayer insulating film 25. The reason for connecting lower electrode 51 and connecting plug 12 to each other by way of landing pad 81 in the semiconductor device of FIG. 1 is to stabilize electrical connection by enlarging a contact area between lower electrode 51 and connecting plug 12. Accordingly, landing pad 81 may not be formed in some cases.

Next, an explanation will be made of the peripheral circuit region. In the peripheral circuit region (logic circuit region) of FIG. 1, a field-effect transistor for a peripheral circuit is formed in an active region defined by isolation insulating film 2 in the principal surface of silicon substrate 10. This field-effect transistor includes gate electrode 4 formed on the principal surface of the active region through gate insulating film 3. In addition, impurity-diffused regions 7 and 7a (third and fourth impurity-diffused regions) in a pair to serve as a source region and a drain region are respectively formed on one and the other sides of gate electrode 4 within silicon semiconductor substrate 10.

One impurity-diffused region 7 of this transistor is electrically connected to second layer interconnect 61 by way of metal plugs 41, 42 and 43, first layer interconnect 8a, and local interconnect 81a. These metal plugs 41, 42 and 43 constitute a third contact plug.

The other impurity-diffused region 7a is electrically connected to first layer interconnect 8b by way of metal plug 41a.

First layer interconnect 8b is, in turn, electrically connected to local interconnect 81b by way of metal plug 42a. This first layer interconnect 8b is also electrically connected, by way of another metal plug, to another impurity-diffused region located in the depth direction of the drawing. In addition, local interconnect 81b is electrically connected by way of metal plug 43a to second layer interconnect 61a.

There is a 1.5 μm-high capacitor in the memory cell region and foundation layer 36 made of a silicon nitride film is formed on a portion of plane-A between adjacent lower electrodes 51. The foundation layer 36 support the lower electrodes so that the electrodes neither come into contact with each other nor collapse. In addition, lower conductive region 51a made of a first titanium nitride film is provided in the boundary region and interlayer insulating film 24 is formed on a closer side to the peripheral circuit region (logic circuit region) than this lower conductive region 51a.

In the present exemplary embodiment, a dielectric film having the same thickness as in the memory cell region, the convex portion of the upper conductive region, the conductive layer of the upper conductive region are formed on lower conductive region 51a of the boundary region. In addition, a dielectric film having the same thickness as in the memory cell region and the conductive layer of the upper conductive region having the same thickness as in the memory cell region are formed on the foundation layer of the boundary region. In this way, in the semiconductor device of the present exemplary embodiment, the dielectric film, the convex portion of the upper conductive region and the conductive layer are formed on the lower conductive region in the boundary region, and the dielectric film and the conductive layer of the upper conductive region are formed on the foundation layer, as in the memory cell region. Consequently, it is possible to prevent step differences from being produced in the boundary region and the peripheral circuit region with respect to the memory cell region.

In addition, in the peripheral circuit region, it is possible to use the foundation layer (this foundation layer is removed in an intermediate step and is, therefore, not illustrated in the peripheral circuit region of FIG. 1) as a mask when removing the interlayer insulating film at the time of wet etching. Consequently, there is no need to newly form a photoresist film to be used as a mask. As a result, it is possible to prevent foreign matter attributable to wet etching from being produced. In addition, there is no need to secure a margin for alignment between this photoresist film and the lower conductive region. Thus, it is possible to miniaturize the boundary region between the memory cell region and the peripheral circuit (logic circuit) region.

Furthermore, by forming the foundation layer in a portion of plane-A between lower electrodes, it is possible to prevent the lower electrodes from collapsing and adjacent lower electrodes from coming into contact with each other. As a result, it is possible to improve a yield at the time of manufacture.

Method for Manufacturing Semiconductor Device

Next, a method for manufacturing the semiconductor memory device illustrated in FIG. 1 will be described using FIGS. 1 to 19. First, the principal surface of silicon substrate 10 was defined by isolation insulating film 2. Next, gate oxide film 3, gate electrode 4, diffusion layer regions 5, 6, 7 and 7a, polysilicon plugs 11 and 11a, metal plugs 41 and 41a, interlayer insulating film 21 (oxide silicon film), interlayer insulating film 31 (silicon nitride film), bit line 8, and first layer interconnects 8a and 8b were formed successively. Bit line 8 and first interconnect layers 8a and 8b can be formed using the same interconnect layer.

Subsequently, interlayer insulating film 22 (oxide silicon film) was formed on bit line 8 and on first layer interconnects 8a and 8b. After this, contact holes were created within interlayer insulating film 22. Then, in the memory cell region, a surface of polysilicon plug 11 was exposed on the bottom face of a contact hole. Likewise, in the peripheral circuit region (logic circuit region), surfaces of first interconnects 8a and 8b were exposed on the bottom faces of contact holes. Next, a titanium film, a titanium nitride film and a tungsten film were filled into the contact holes within the memory cell region and the peripheral circuit region (logic circuit region). After this, portions of the titanium film, the titanium nitride film and the tungsten film external to the contact holes were removed using a CMP method, thereby forming metal plugs 12, 42 and 42a.

Figure 2:
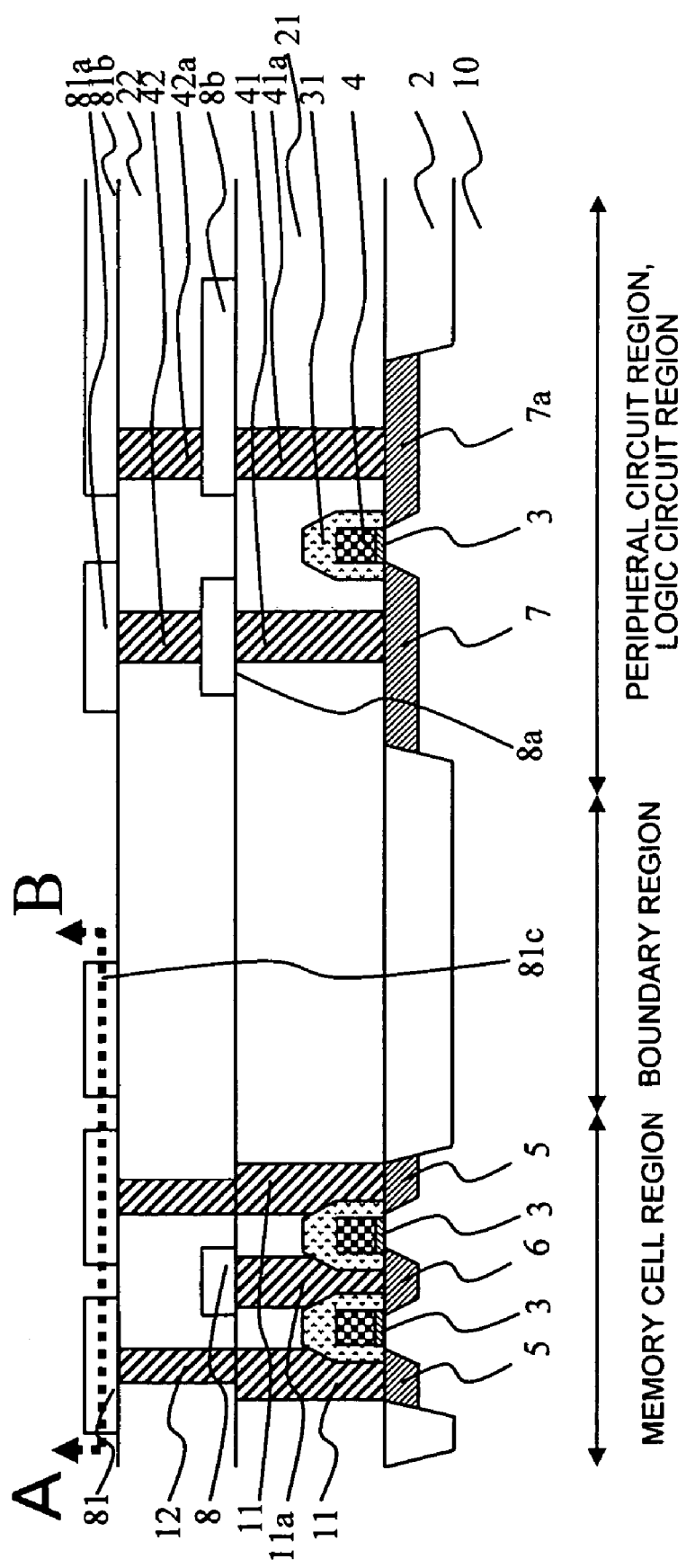
FIG. 2 is a schematic view illustrating one step of a method for manufacturing a semiconductor device of the present invention.
Figure 3:
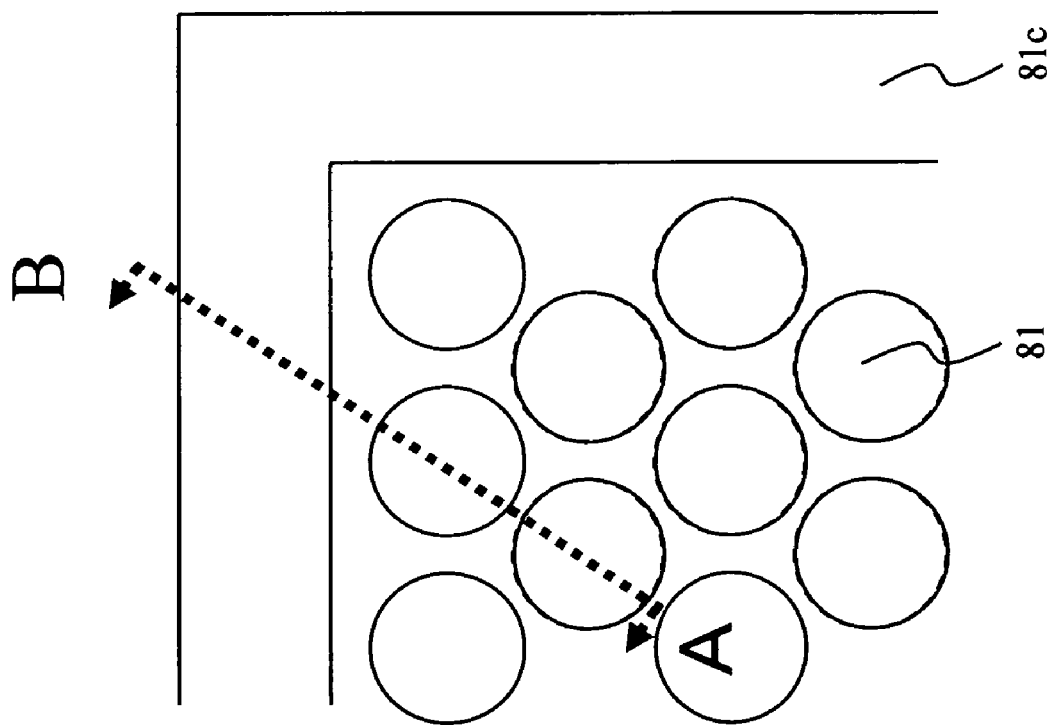
FIG. 3 is another schematic view illustrating one step of a method for manufacturing the semiconductor device of the present invention.

After this, a tungsten nitride film and a tungsten film were formed using a sputtering method, and then these films were subjected to patterning using a photolithographic technique and a dry etching technique. Consequently, there were formed landing pad 81 in the memory cell region, local interconnects 81a and 81b in the peripheral circuit region (logic circuit region), and lower layer 81c in the boundary region. FIG. 2 is a cross-sectional view illustrating this condition, whereas FIG. 3 is a top view taken at an edge of the memory cell region after the patterning of landing pad 81 and lower layer 81c. The cross-section denoted by line A-B in FIG. 3 corresponds to the cross-section denoted by line A-B in FIG. 2.

Figure 4:
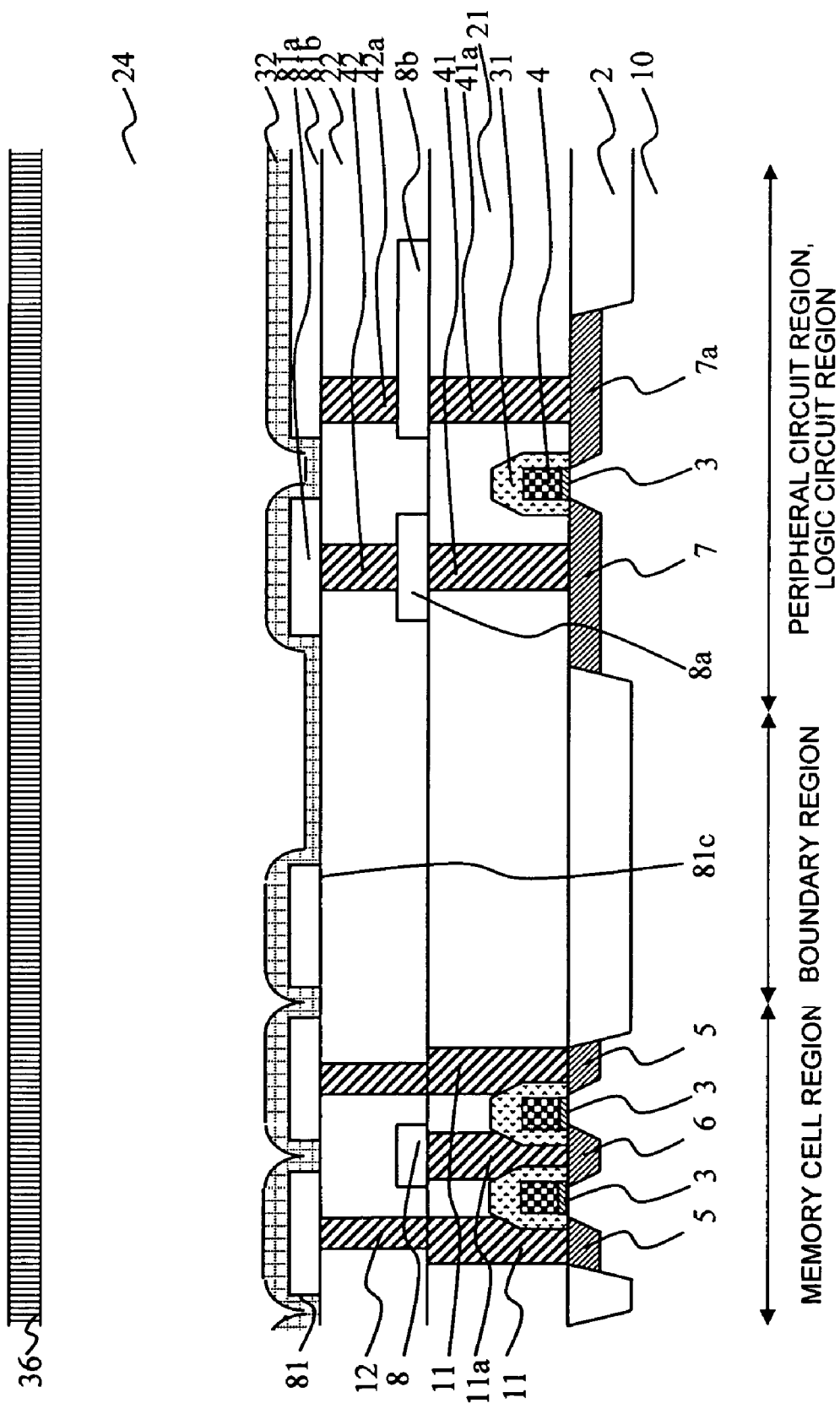
FIG. 4 is yet another schematic view illustrating one step of a method for manufacturing the semiconductor device of the present invention.

Next, there were successively formed a silicon nitride film as interlayer insulating film 32, a 1.5 μm-thick oxide silicon film as interlayer insulating film 24, and a 100 nm-thick silicon nitride film as foundation layer 36 (FIG. 4). A thickness of the interlayer insulating film is preferably in a range from 0.5 μm to 4.0 μm. A thickness of the foundation layer is preferably in a range from 50 nm to 200 nm.

Figure 5:
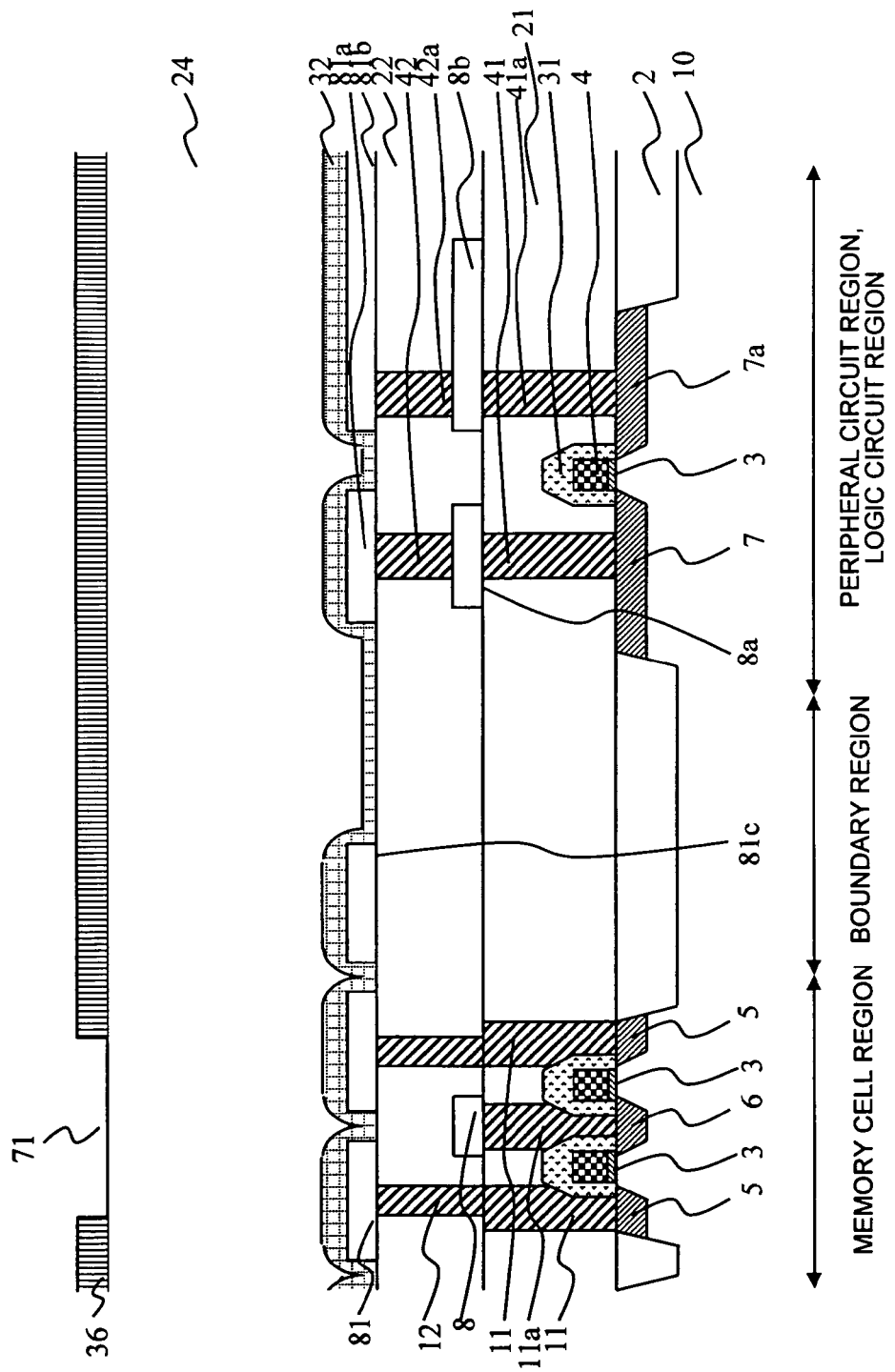
FIG. 5 is still another schematic view illustrating one step of a method for manufacturing the semiconductor device of the present invention.
Figure 6:
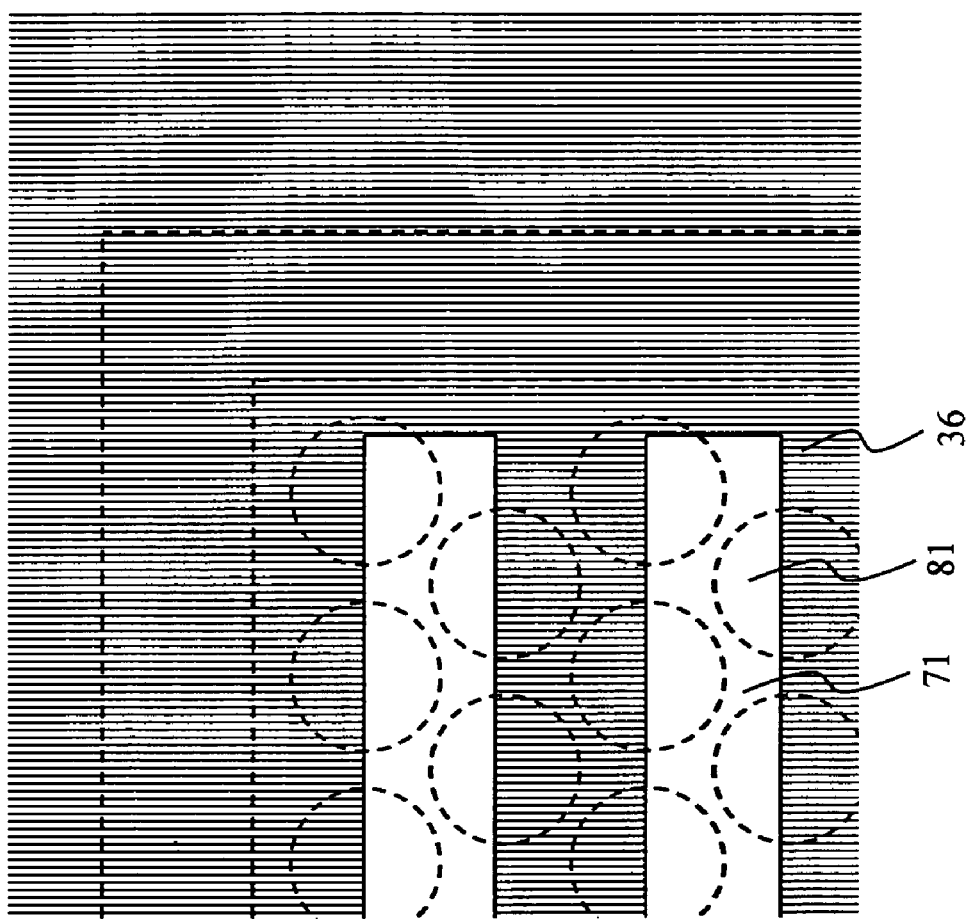
FIG. 6 is still another schematic view illustrating one step of a method for manufacturing the semiconductor device of the present invention.
Figure 7:
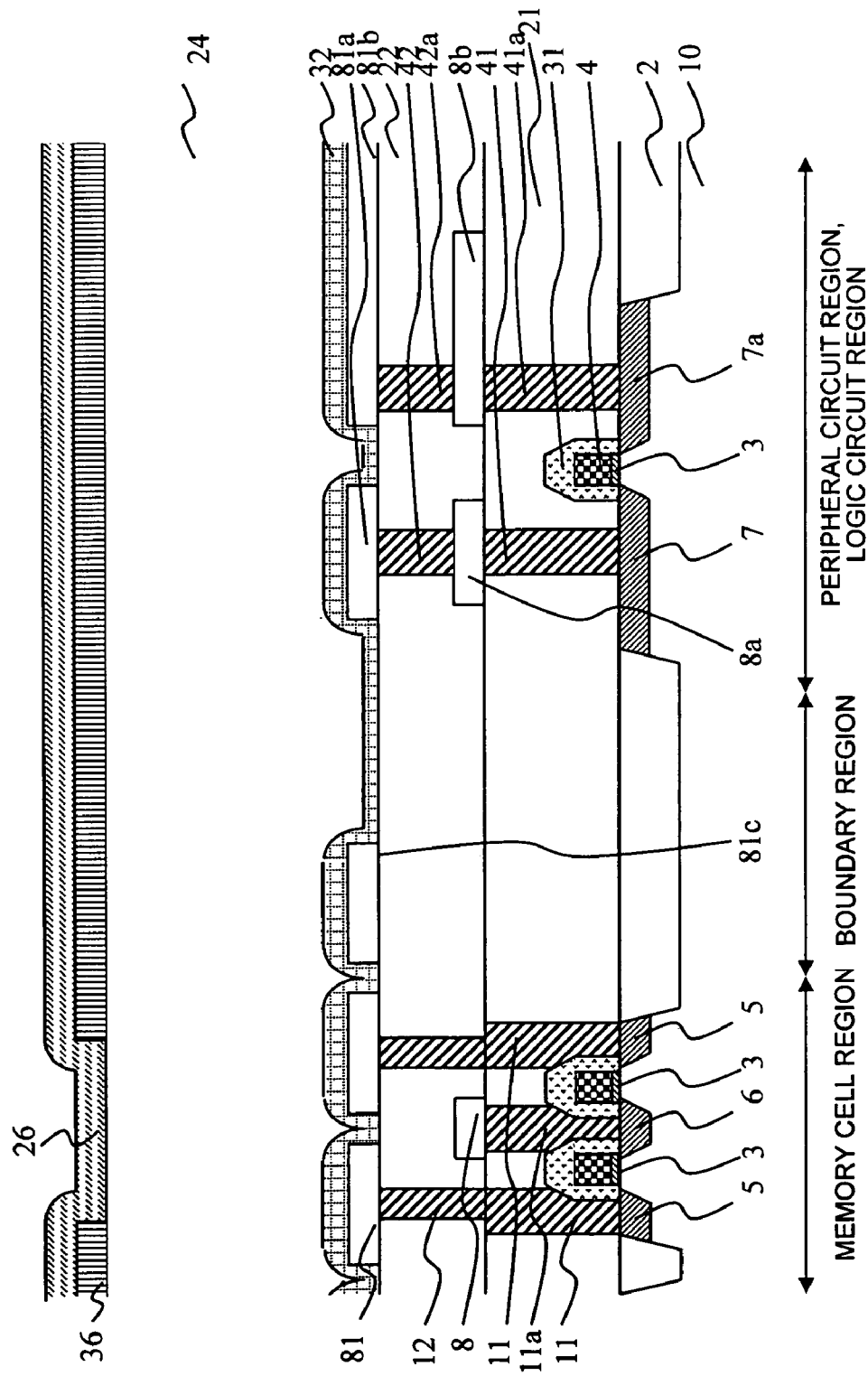
FIG. 7 is still another schematic view illustrating one step of a method for manufacturing the semiconductor device of the present invention.

Next, foundation layer 36 was processed using a photolithographic technique and a dry etching technique, so as to comprise an opening in a position corresponding to landing pad 81 in the memory cell region. At this time, the processing was performed so that foundation layer 36 remained on the entire surfaces of the boundary region and the peripheral circuit region (logic circuit region). FIG. 5 is a cross-sectional view illustrating this condition, whereas FIG. 6 represents a top view taken at an edge of the memory cell region after the patterning of foundation layer 36. The foundation layer at the memory cell region operates as a support layer of the lower electrode of the capacitor.

Figure 8:
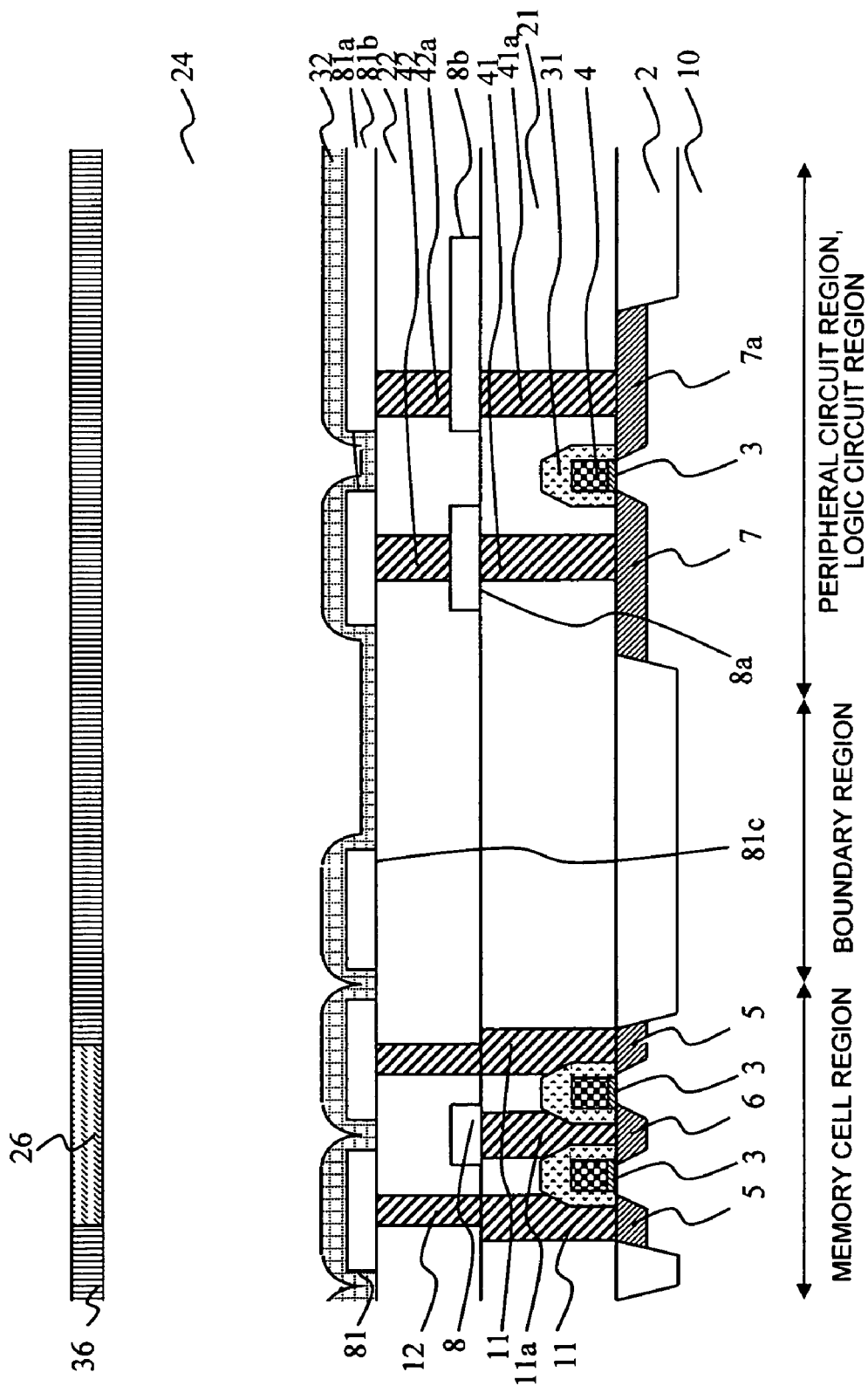
FIG. 8 is still another schematic view illustrating one step of a method for manufacturing the semiconductor device of the present invention.
Figure 9:
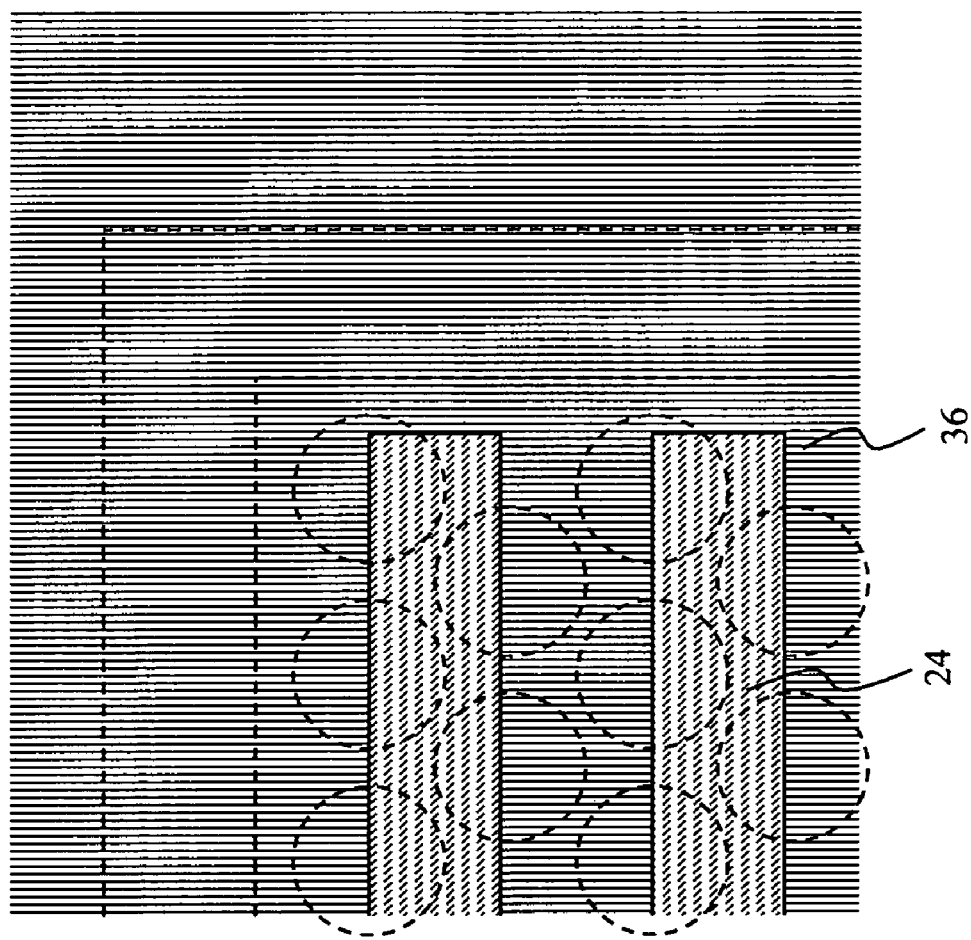
FIG. 9 is still another schematic view illustrating one step of a method for manufacturing the semiconductor device of the present invention.

Next, after forming interlayer insulating film (oxide silicon film) 26 so as to fill the opening of foundation layer 36 (FIG. 7), interlayer insulating film 26 on foundation layer 36 was removed using a CMP method. FIG. 8 is a cross-sectional view illustrating this condition, whereas FIG. 9 represents a top view taken at an edge of the memory cell region after the chemical-mechanical polishing of interlayer insulating film 26.

Figure 10:
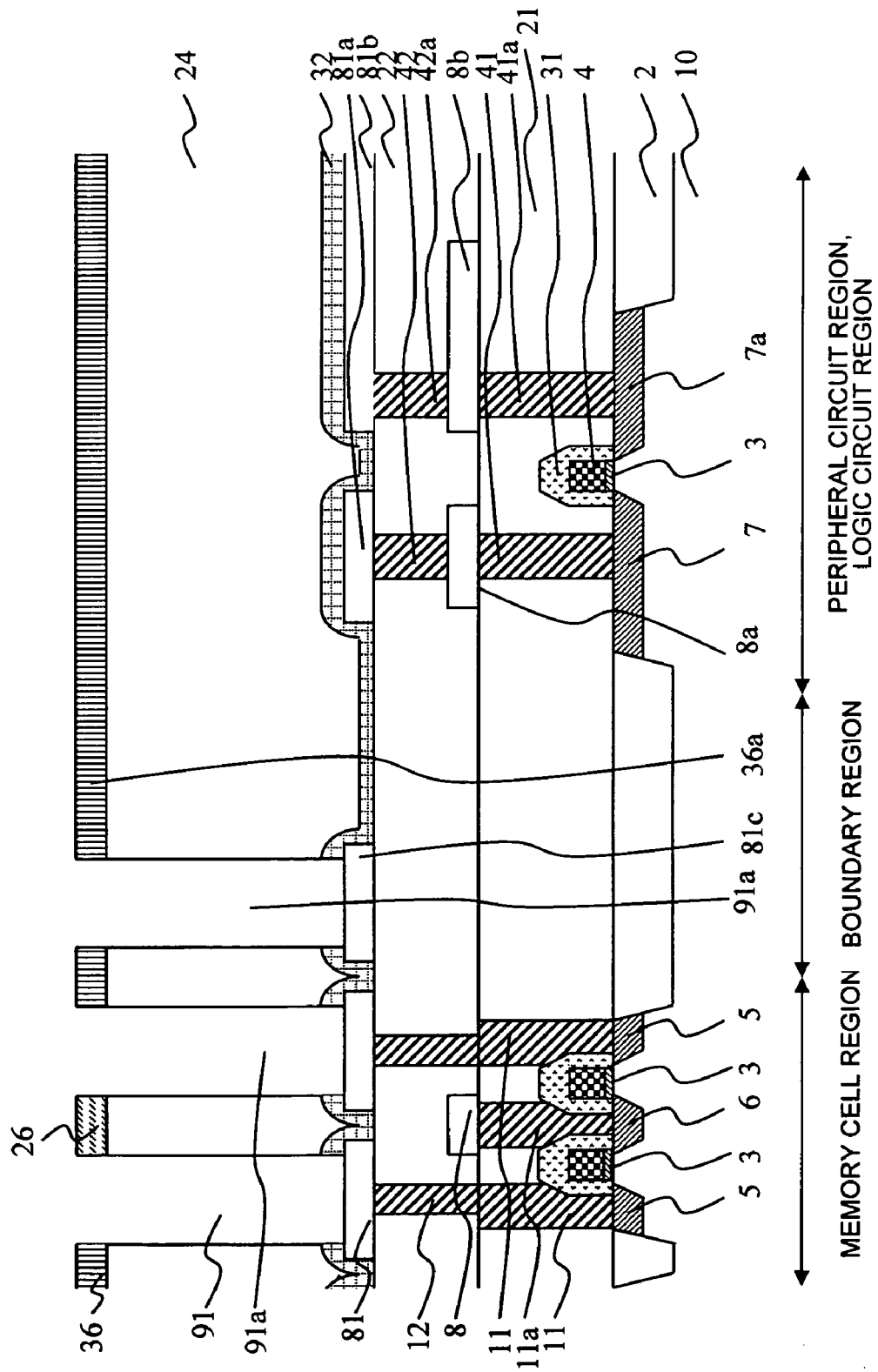
FIG. 10 is still another schematic view illustrating one step of a method for manufacturing the semiconductor device of the present invention.
Figure 11:
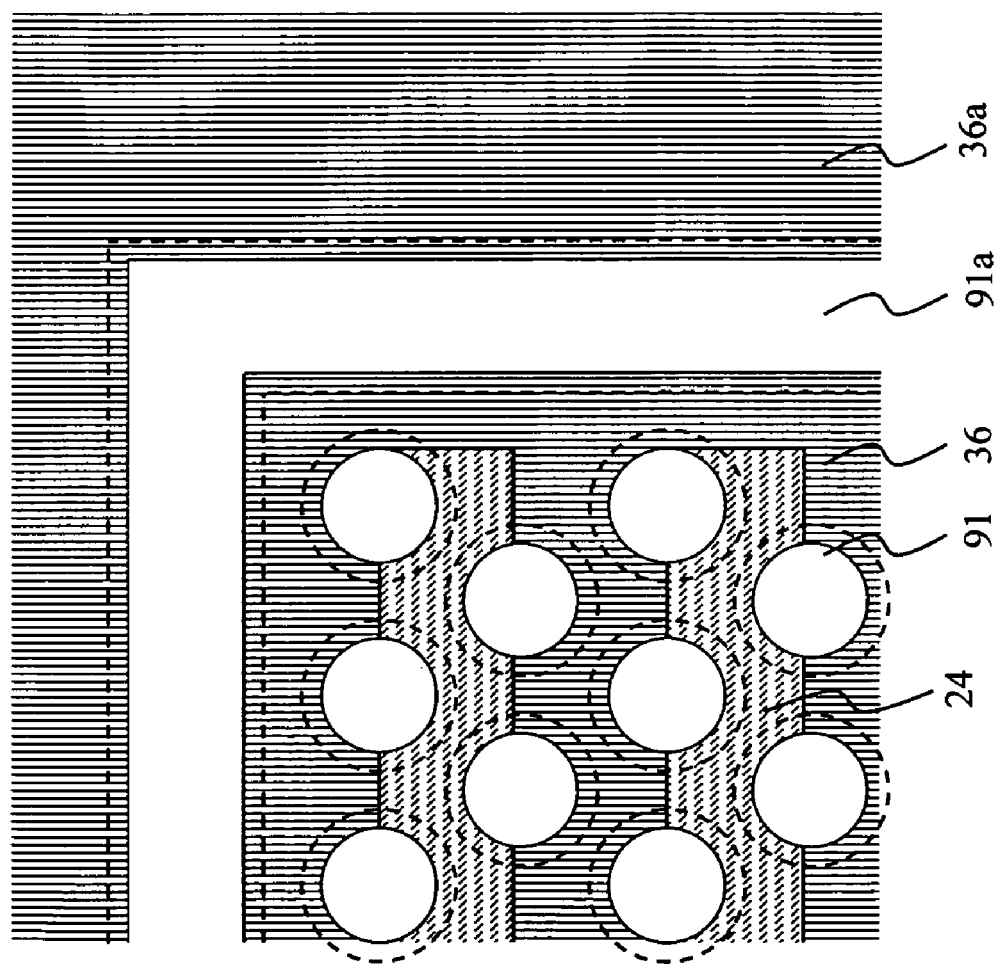
FIG. 11 is still another schematic view illustrating one step of a method for manufacturing the semiconductor device of the present invention.

Next, cylinder hole 91 was created using a photolithographic technique and a dry etching technique, so as to penetrate through interlayer insulating films 24 and 32 and foundation layer 36. Then, a surface of landing pad 81 was exposed on the bottom face of this cylinder hole 91. In addition, one cylinder trench 91a was created on lower layer 81c of the landing pad layer in the boundary region concurrently with creating cylinder hole 91. FIG. 10 is a cross-sectional view illustrating this condition, whereas FIG. 11 represents a top view taken at an edge of the memory cell region after the creation of cylinder hole 91. Hereinafter, the foundation layer covering the peripheral circuit region will be symbolized as 36a.

Figure 12:
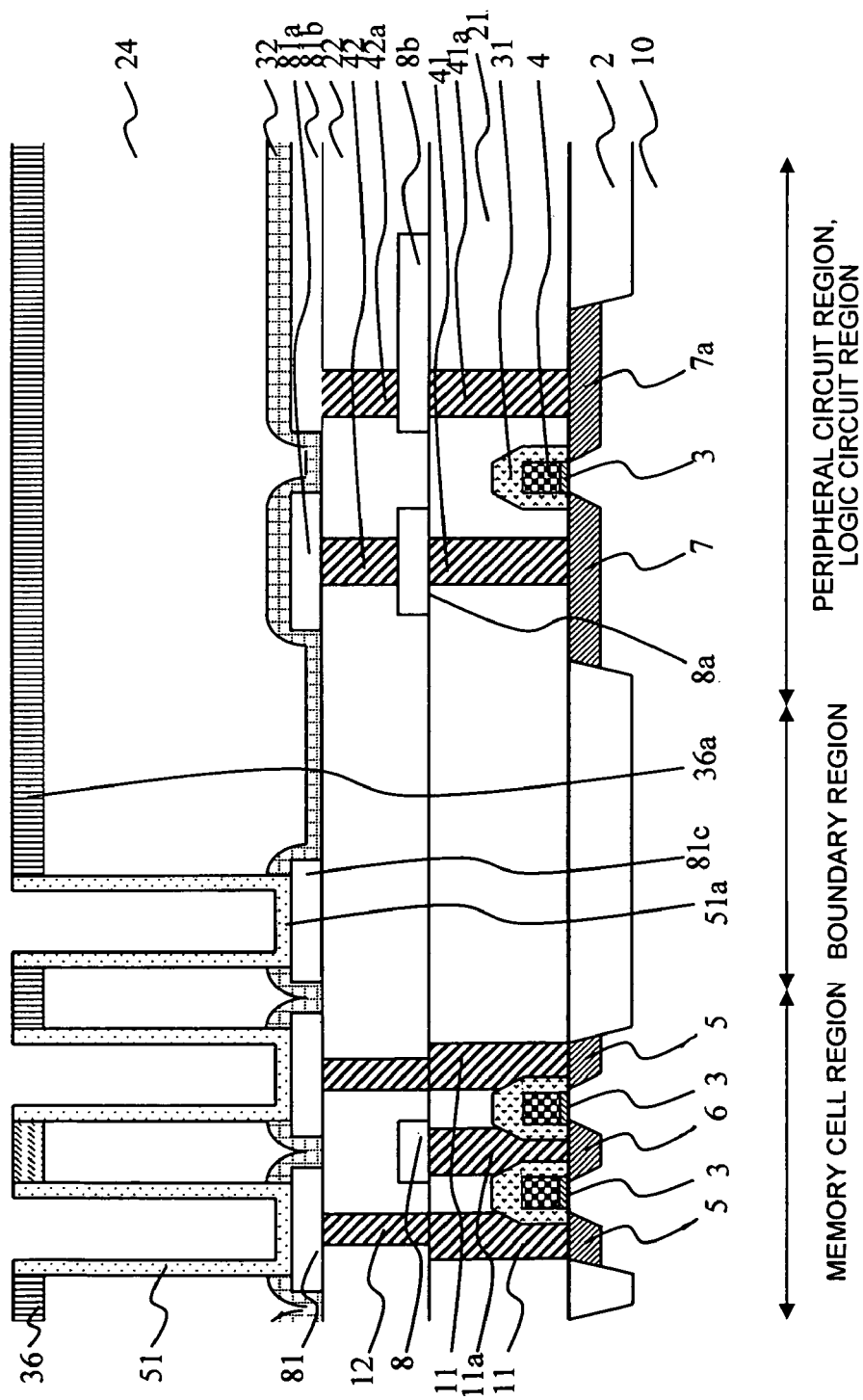
FIG. 12 is still another schematic view illustrating one step of a method for manufacturing the semiconductor device of the present invention.
Figure 13:
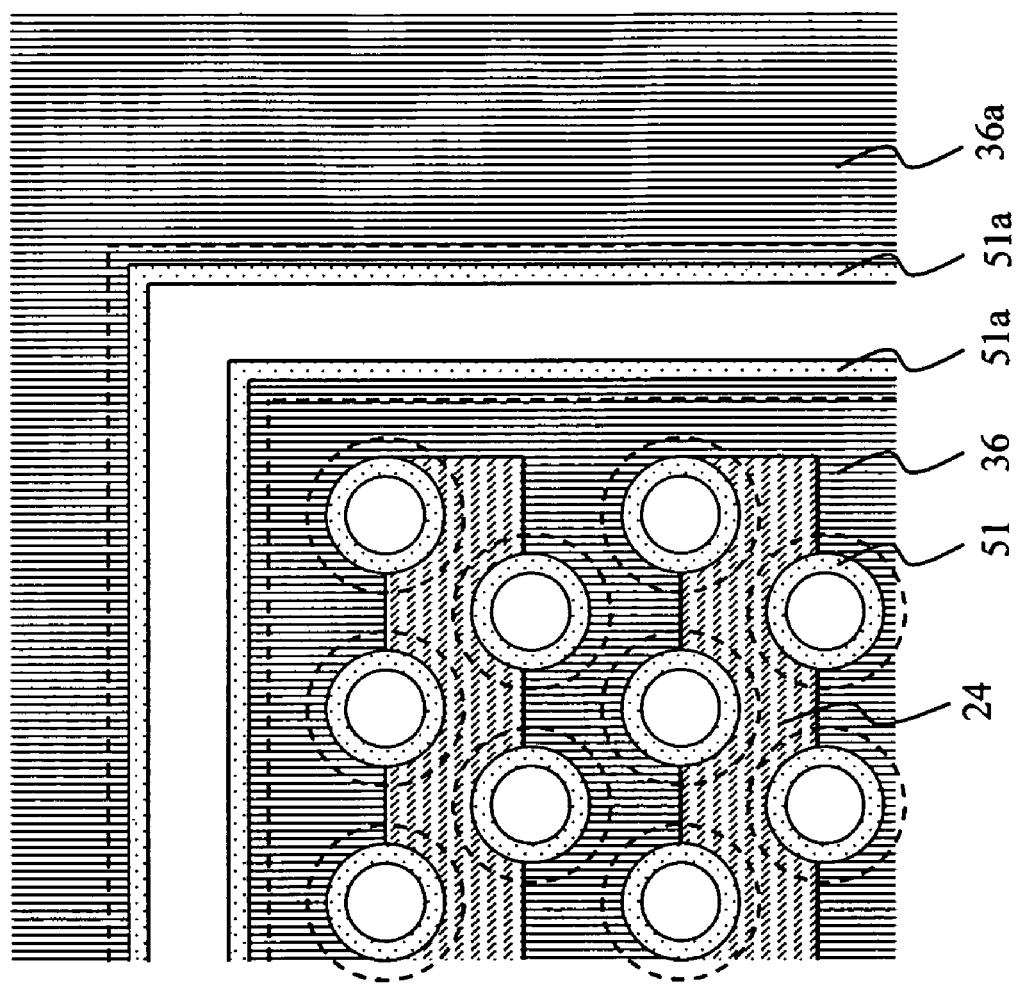
FIG. 13 is still another schematic view illustrating one step of a method for manufacturing the semiconductor device of the present invention.

Next, first titanium nitride film 51 was grown on the entire surface of the semiconductor device being manufactured using a CVD method. Subsequently, portions of the titanium nitride film except for cylinder trench 91 and to the bottom and side surfaces of cylinder trench 91a were etched back and removed, while protecting the titanium nitride film in the bottom of the trenches from being etched by forming a photoresist film (not illustrated) within cylinder trenches 91 and 91a. Next, the photoresist film was removed using an organic separating liquid, thereby obtaining concave lower electrode 51 in the memory cell region and concave lower conductive region 51a in the boundary region. FIG. 12 is a cross-sectional view illustrating this condition, whereas FIG. 13 represents a top view taken at an edge of the memory cell region after the etching back of the titanium nitride film.

Figure 14:
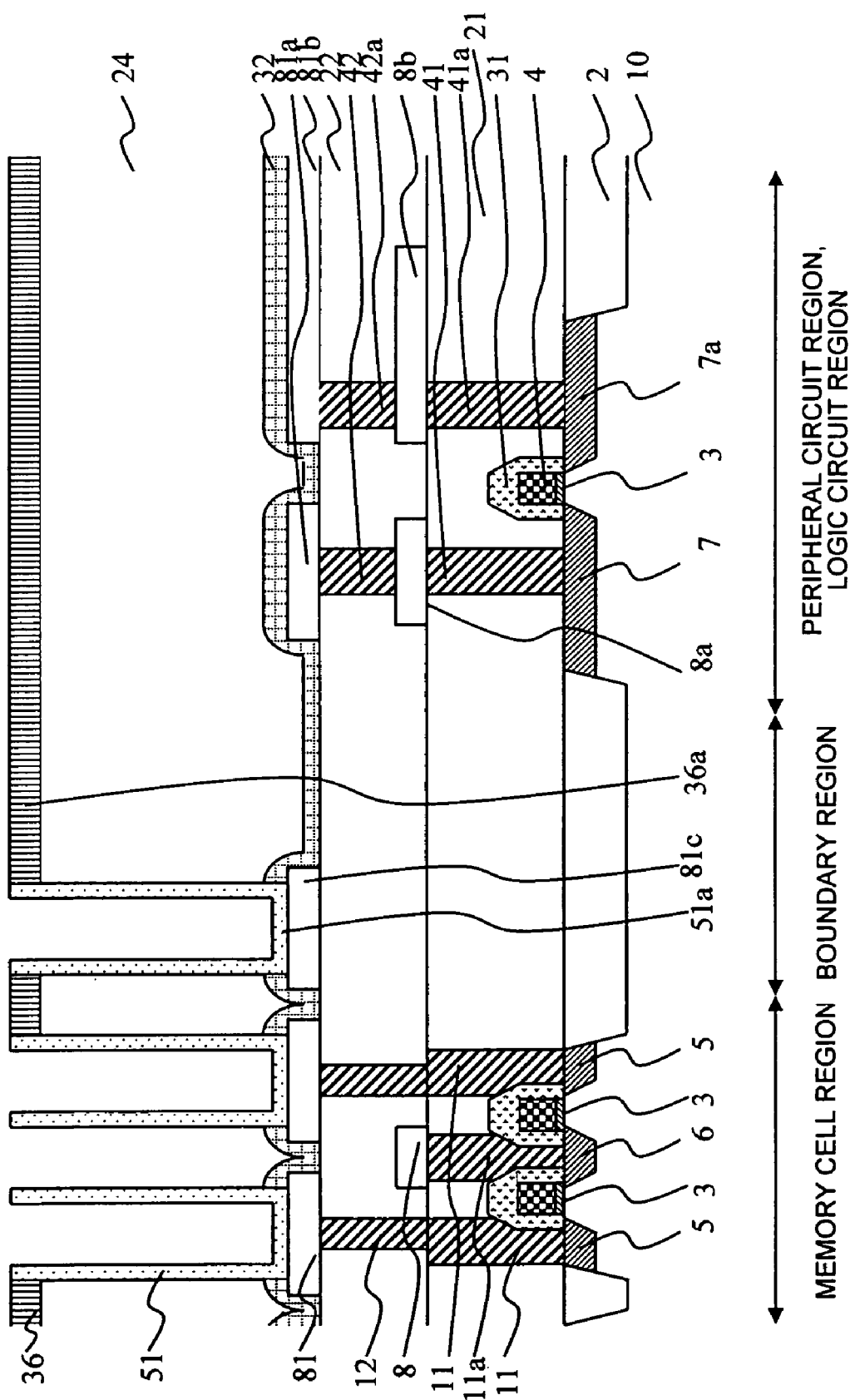
FIG. 14 is still another schematic view illustrating one step of a method for manufacturing the semiconductor device of the present invention.
Figure 15:
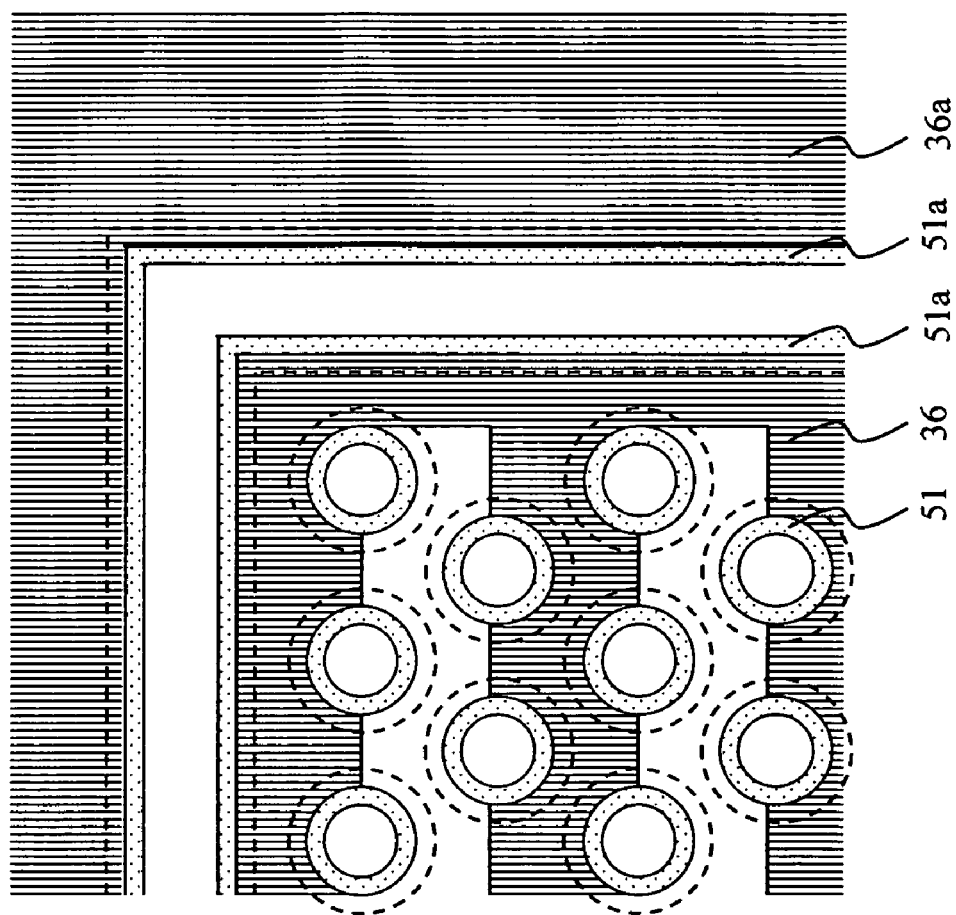
FIG. 15 is still another schematic view illustrating one step of a method for manufacturing the semiconductor device of the present invention.

Next, interlayer insulating film (oxide silicon film) 24 in the memory cell region and in part of the boundary region was removed by a wet etching method using a dilute hydrofluoric acid (HF) solution. Since wet etching proceeded isotropically at this time, interlayer insulating films 24 were also removed, which are present immediately below portion of foundation layer 36 in the memory cell region and in a closer side to the memory cell region than lower conductive region 51a in the boundary region. In addition, foundation layers 36 and 36a functioned as masks, and concave lower electrode 51 and concave lower conductive region 51a functioned as etching stoppers. Consequently, portions of interlayer insulating film (oxide silicon film) 24 remained without being removed, in a part of the boundary region on a closer side to the peripheral circuit region than lower conductive region 51a and in the peripheral circuit region. The foundation layer at the memory cell region keeps a position of the lower electrode, and prevents the lower electrode from collapsing during the wet etching. FIG. 14 is a cross-sectional view illustrating this condition, whereas FIG. 15 represents a top view taken at an edge of the memory cell region after wet etching.

Figure 16:
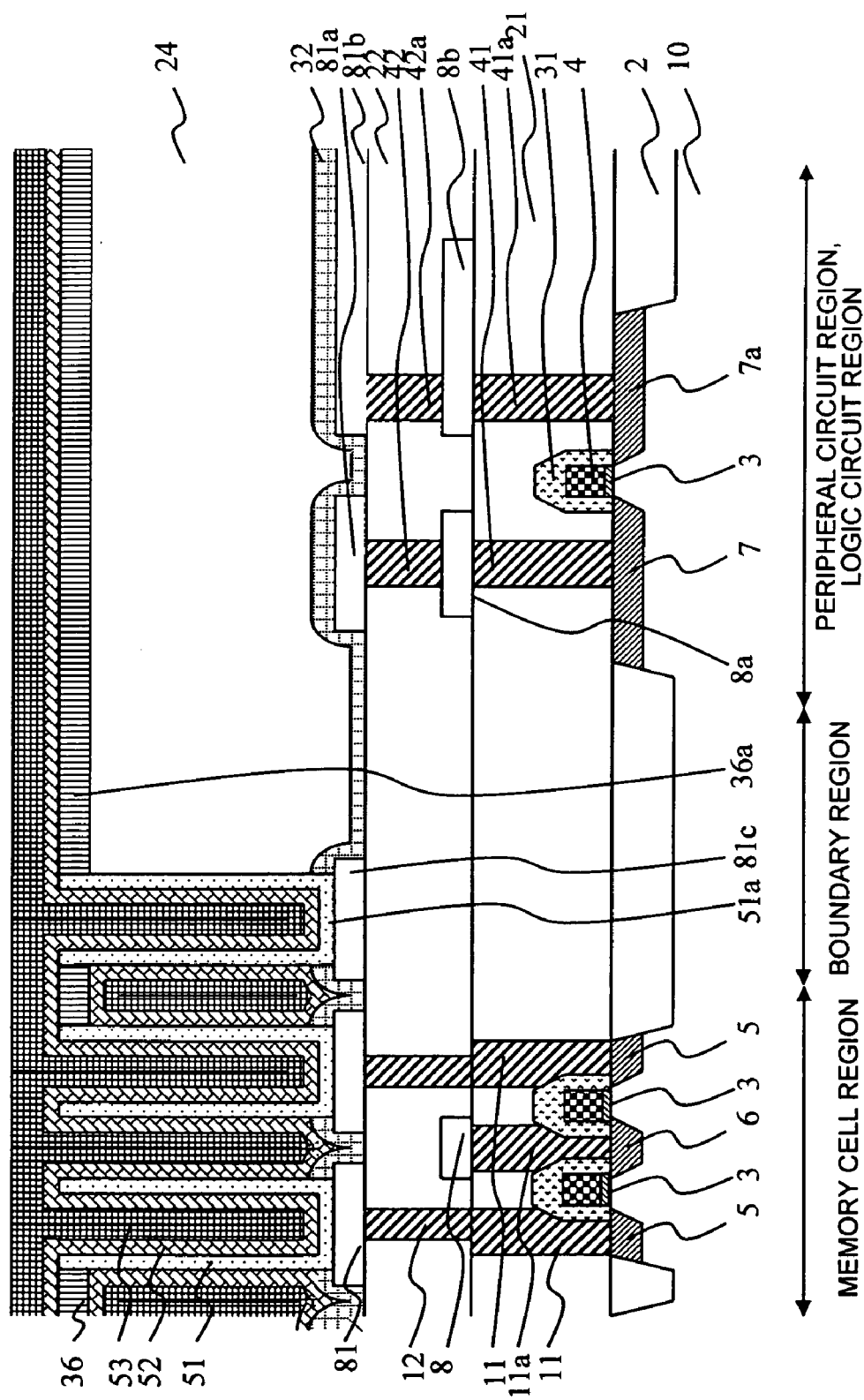
FIG. 16 is still another schematic view illustrating one step of a method for manufacturing the semiconductor device of the present invention.

Next, using an ALD (Atomic Layer Deposition) method, laminated film (dielectric film) 52 composed of an aluminum oxide film and a hafnium oxide film was formed on the entire surface of the semiconductor device being manufactured. Subsequently, using a CVD method, second titanium nitride film 53 was formed on the entire surface as an upper electrode. As a result, in the memory cell region, there was obtained a 1.5 μm-high, crown-shaped capacitor comprised of lower electrode 51, dielectric film 52, and upper electrode 53 (FIG. 16). A height of the capacitor is preferably in a range from 0.5 μm to 4.0 μm.

Figure 17:
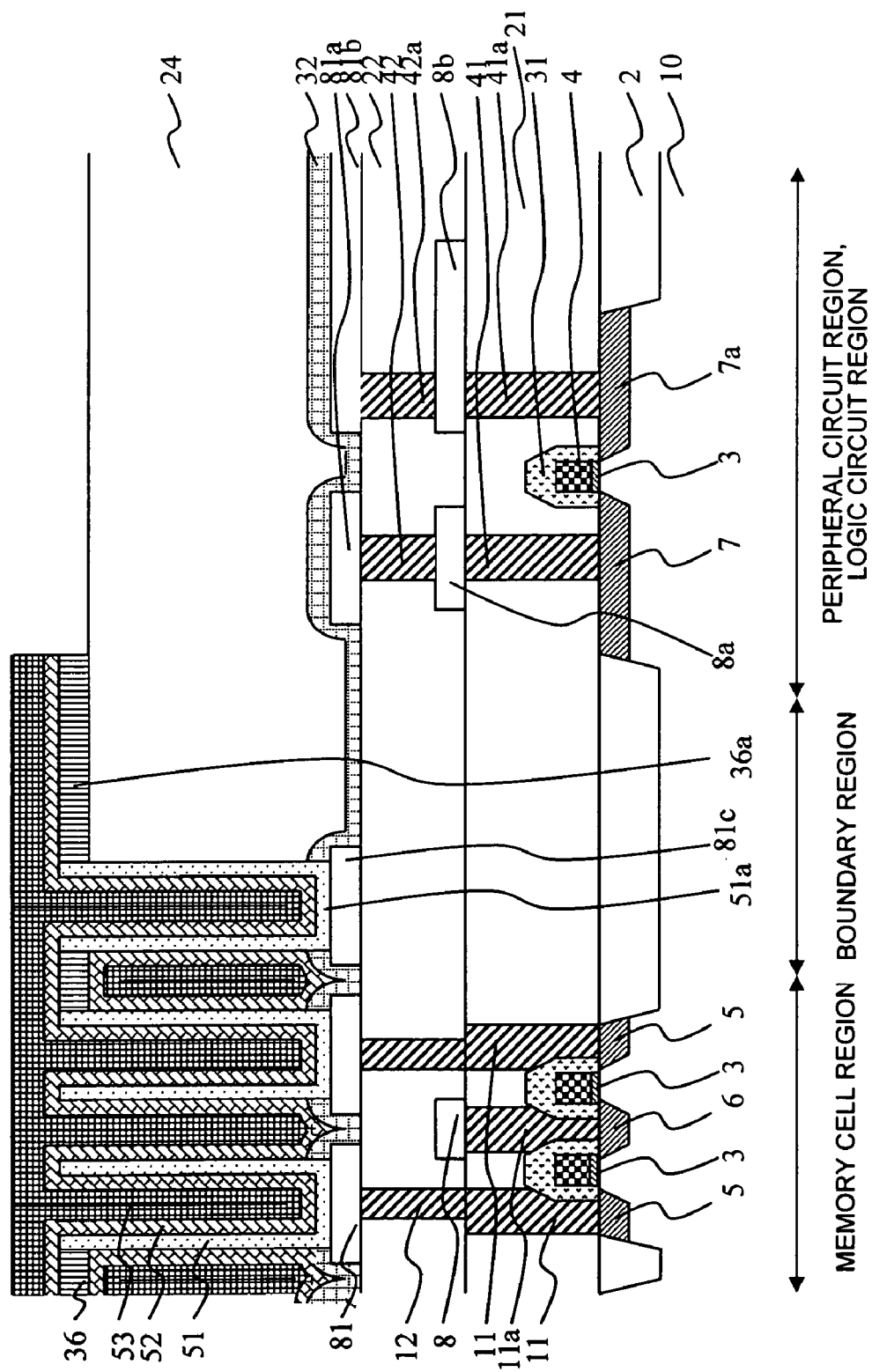
FIG. 17 is still another schematic view illustrating one step of a method for manufacturing the semiconductor device of the present invention.
Figure 18:
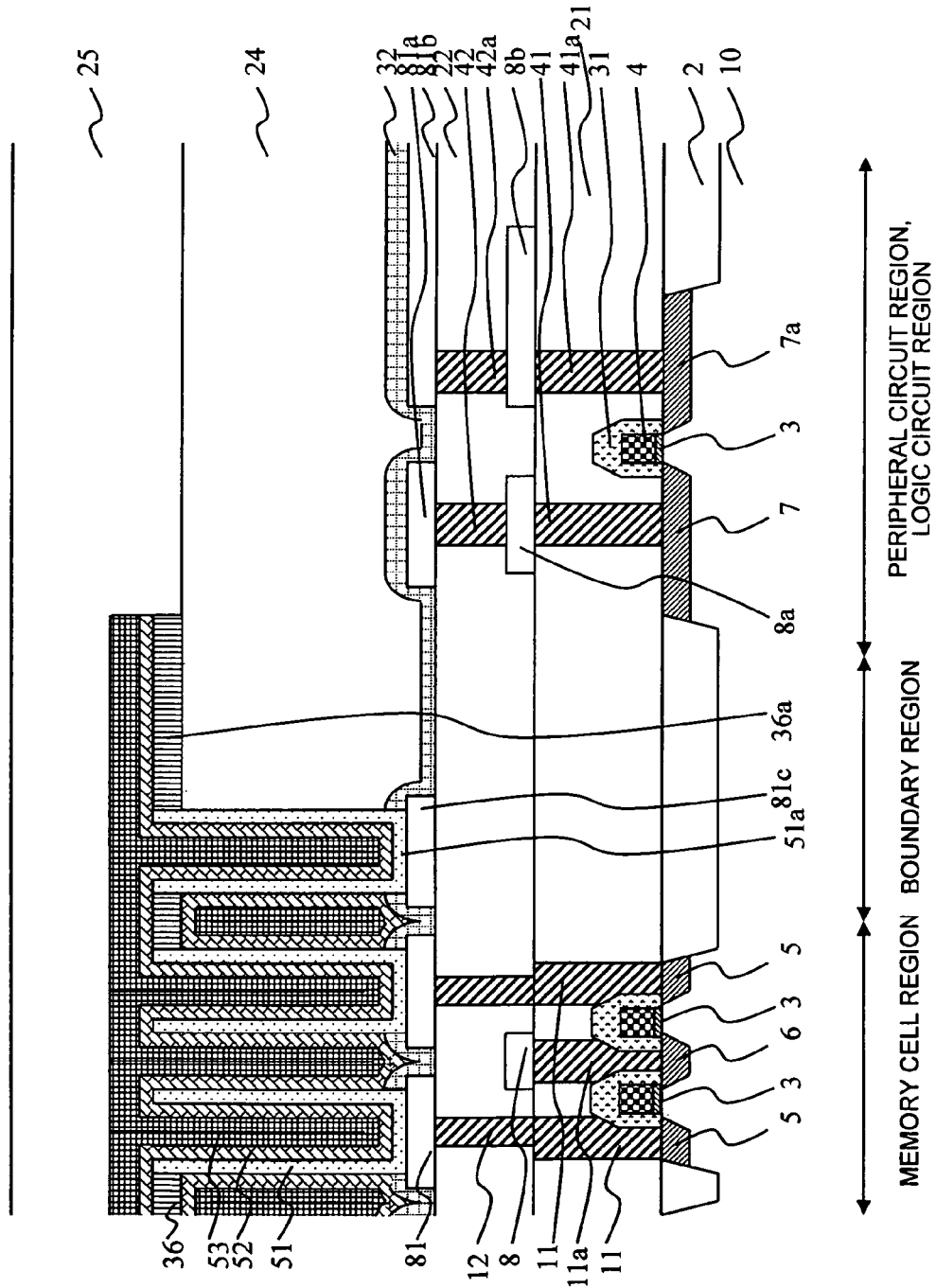
FIG. 18 is still another schematic view illustrating one step of a method for manufacturing the semiconductor device of the present invention.

After this, using a photolithographic technique and a dry etching technique, second titanium nitride film 53, dielectric film 52, and anti-wet etching protective film (foundation layer) 36a in the peripheral circuit region were removed (FIG. 17). Here, the reason for removing anti-wet etching protective film (foundation layer) 36a in the peripheral circuit region is to avoid causing a failure of hole making when creating a contact hole in a later step of forming metal plugs 43 and 43a.

Next, after forming interlayer insulating film (oxide silicon film) 25 on the entire surface of the semiconductor device being manufactured, a step difference between the memory cell region and the peripheral circuit region was eliminated (FIG. 18) using a CMP method.

Figure 19:
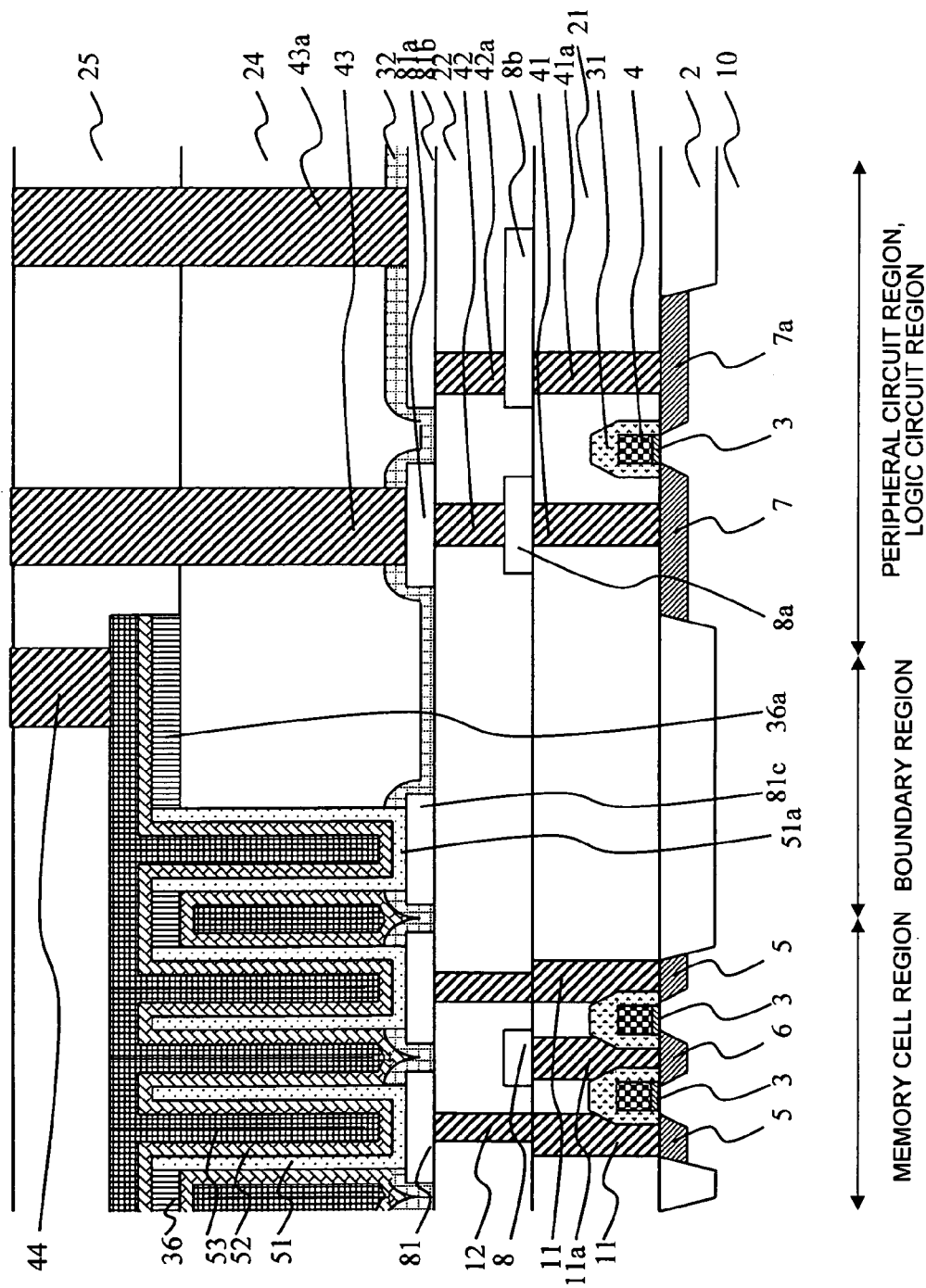
FIG. 19 is still another schematic view illustrating one step of a method for manufacturing the semiconductor device of the present invention.
Figure 20:
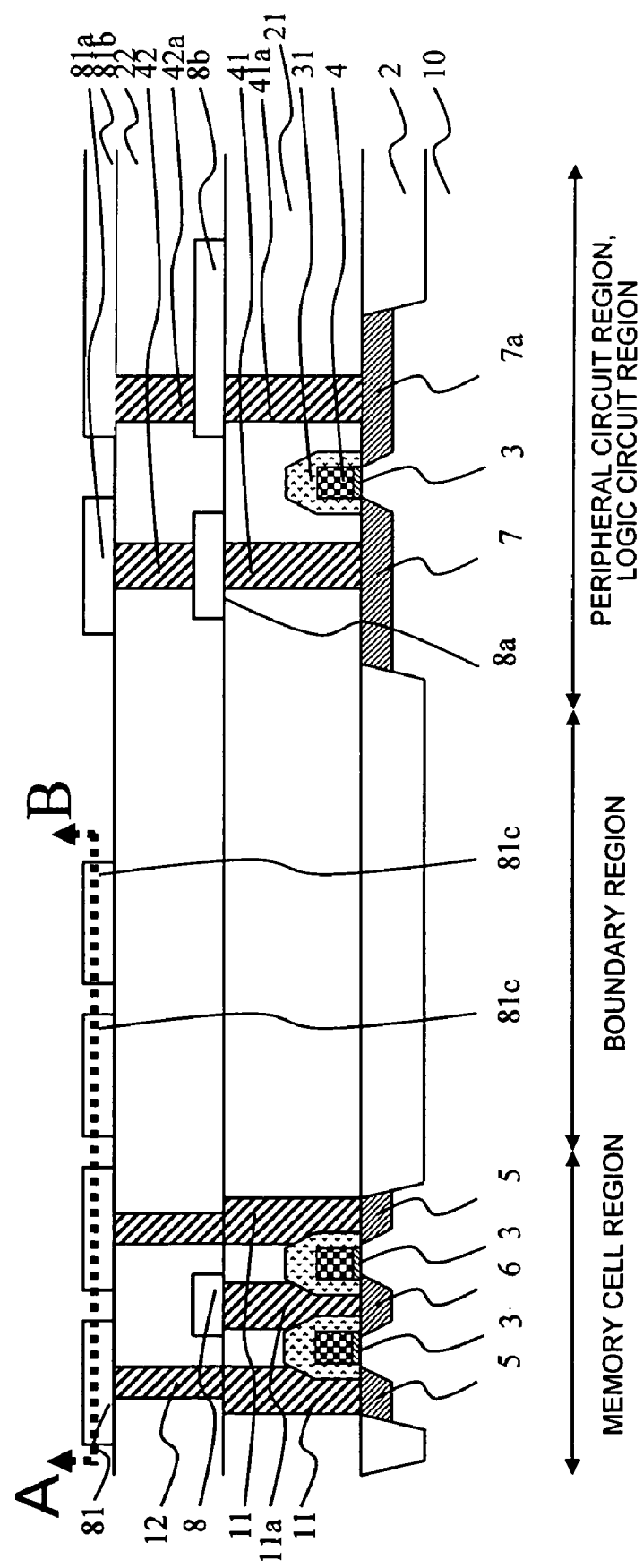
FIG. 20 is a schematic view illustrating one step of a method for manufacturing a related semiconductor device.
Figure 21:
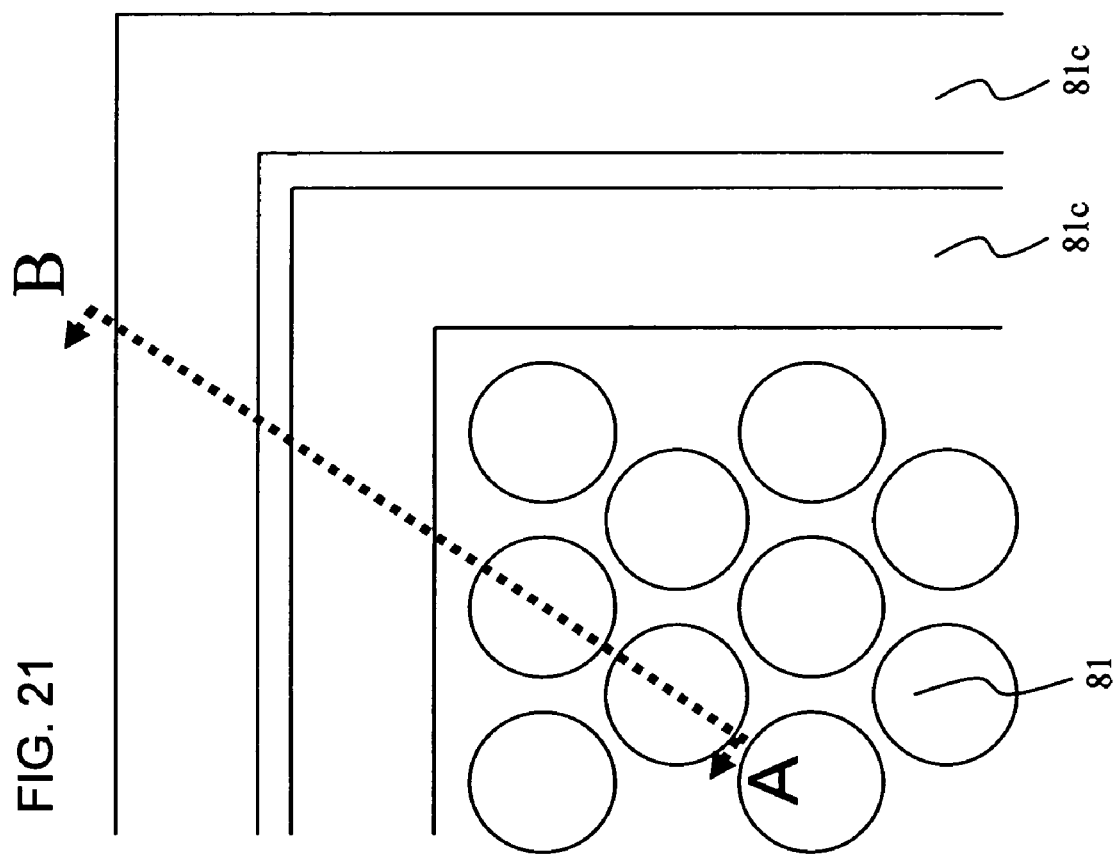
FIG. 21 is another schematic view illustrating one step of a method for manufacturing the related semiconductor device.
Figure 22:
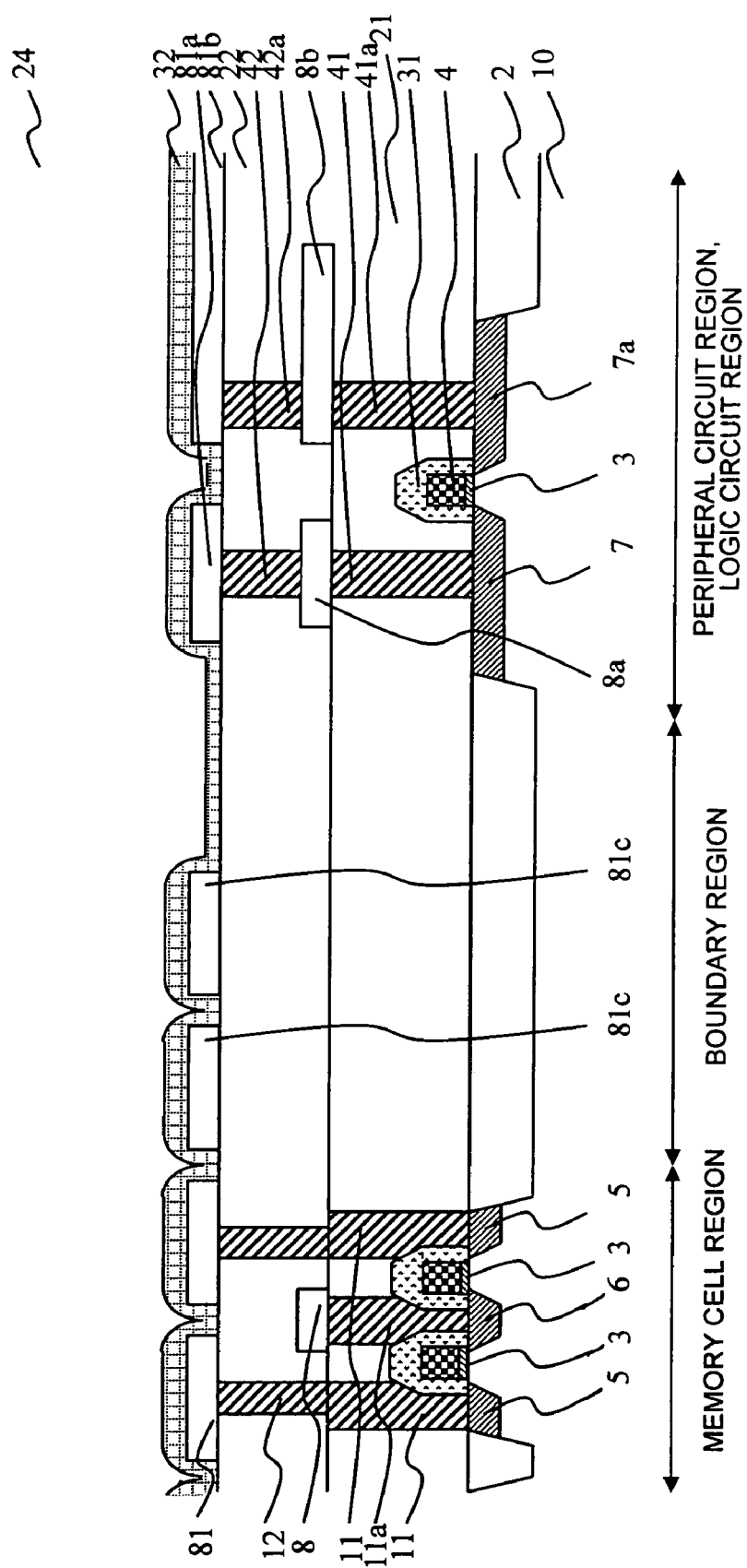
FIG. 22 is yet another schematic view illustrating one step of a method for manufacturing the related semiconductor device.
Figure 23:
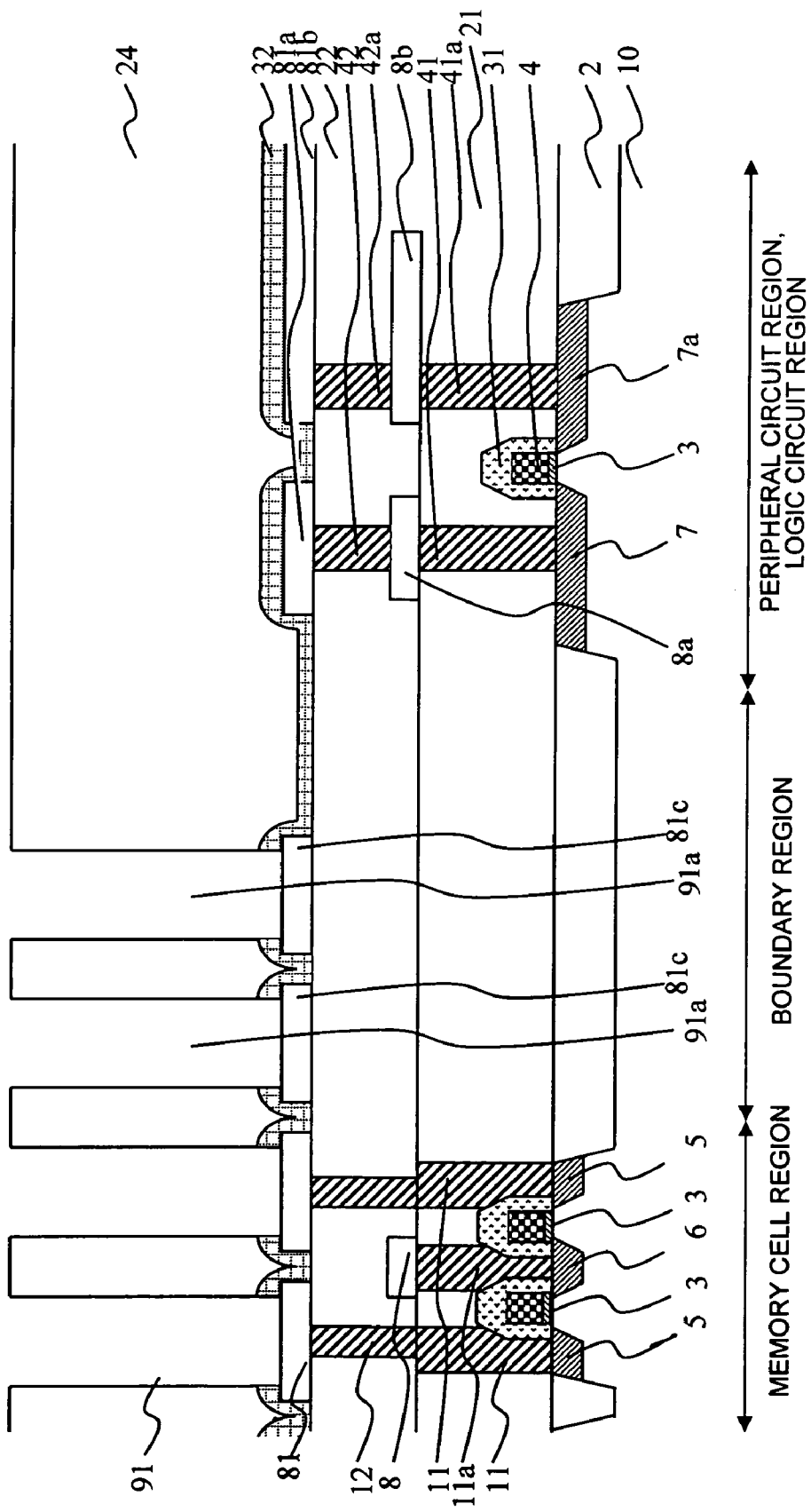
FIG. 23 is still another schematic view illustrating one step of a method for manufacturing the related semiconductor device.
Figure 24:
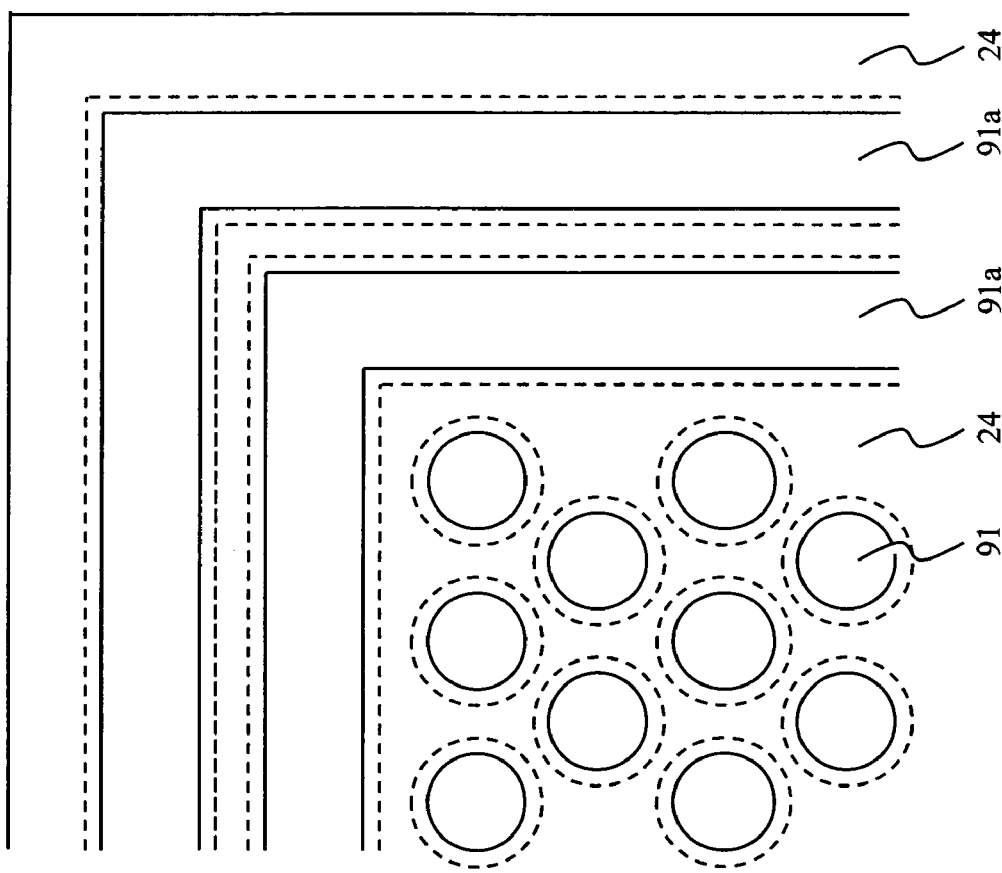
FIG. 24 is still another schematic view illustrating one step of a method for manufacturing the related semiconductor device.
Figure 25:
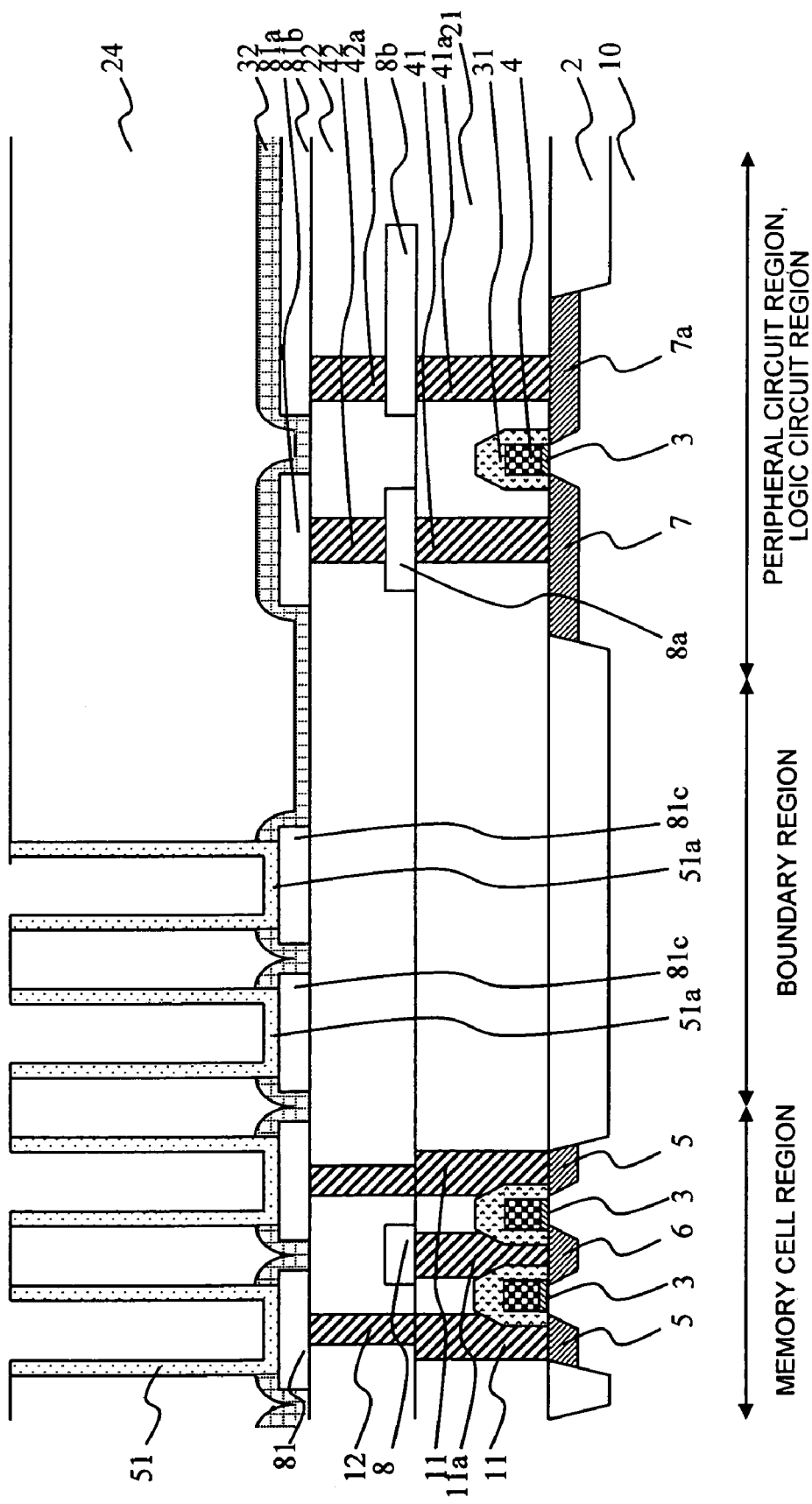
FIG. 25 is still another schematic view illustrating one step of a method for manufacturing the related semiconductor device.
Figure 26:
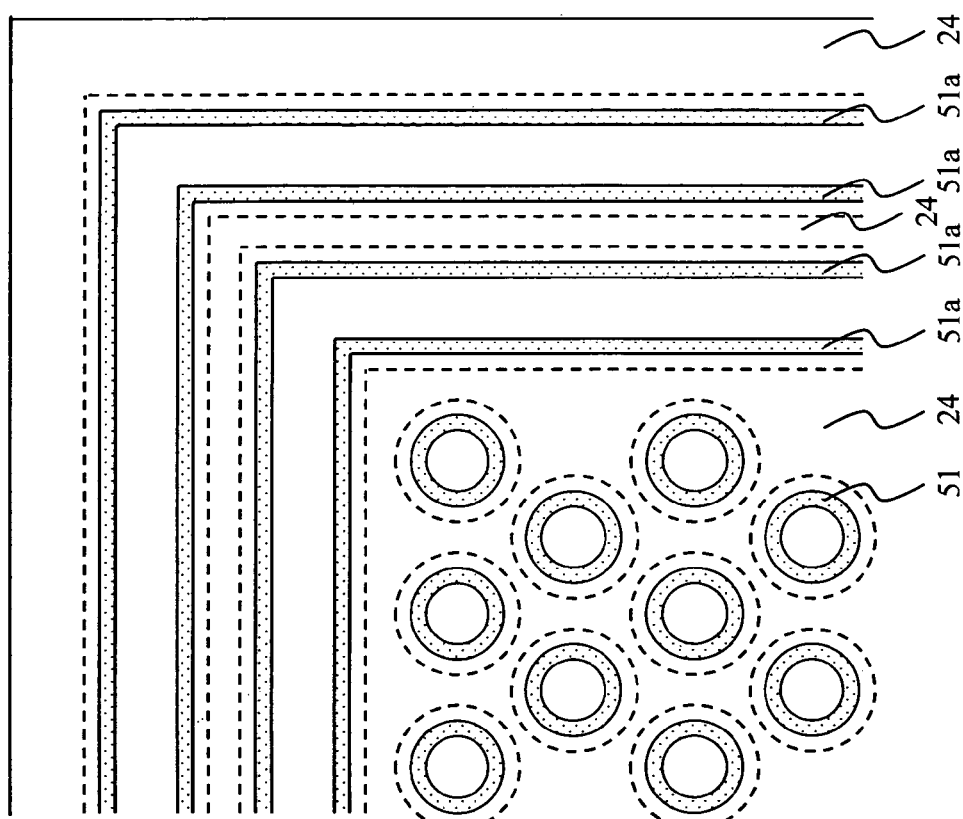
FIG. 26 is still another schematic view illustrating one step of a method for manufacturing the related semiconductor device.
Figure 27:
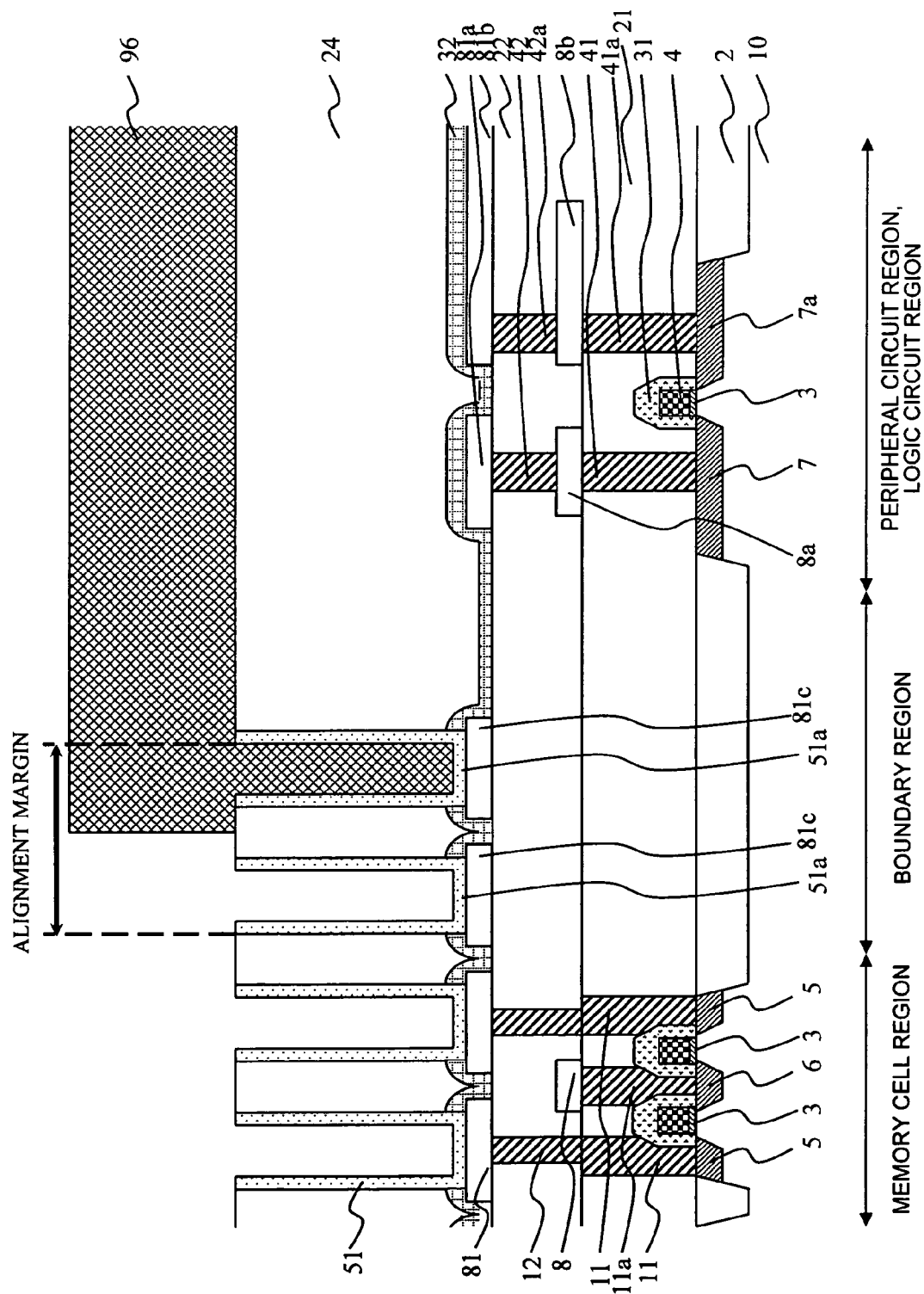
FIG. 27 is still another schematic view illustrating one step of a method for manufacturing the related semiconductor device.
Figure 28:
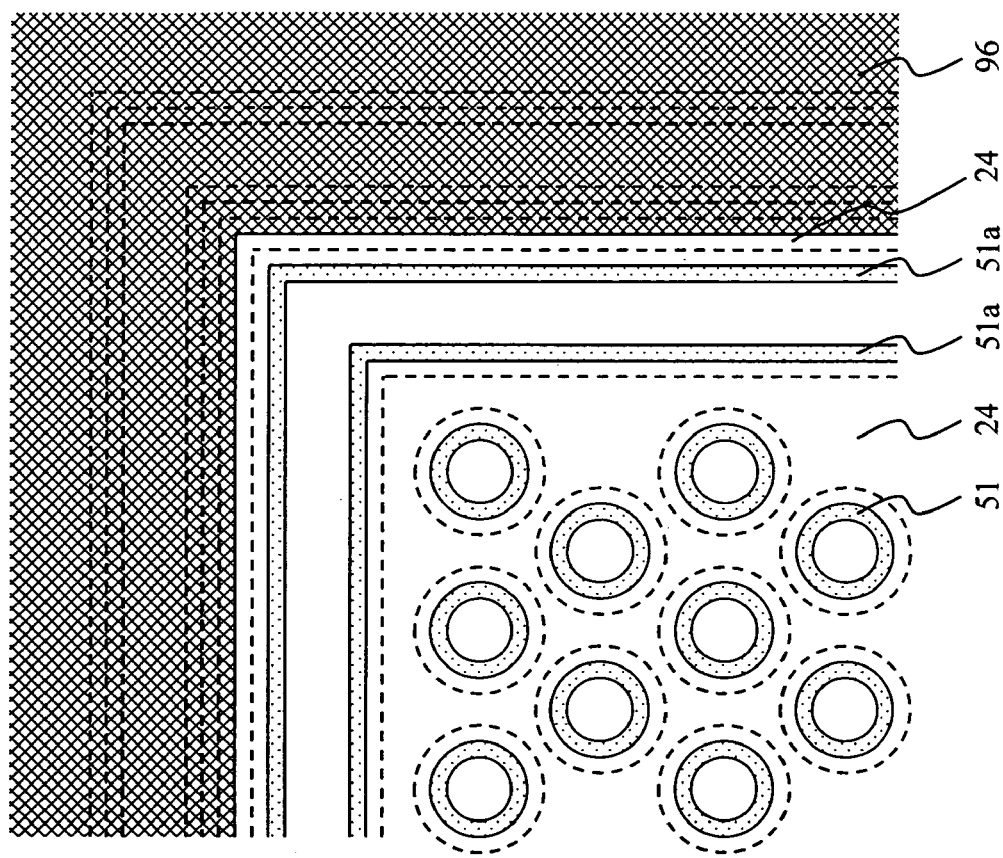
FIG. 28 is still another schematic view illustrating one step of a method for manufacturing the related semiconductor device.
Figure 29:
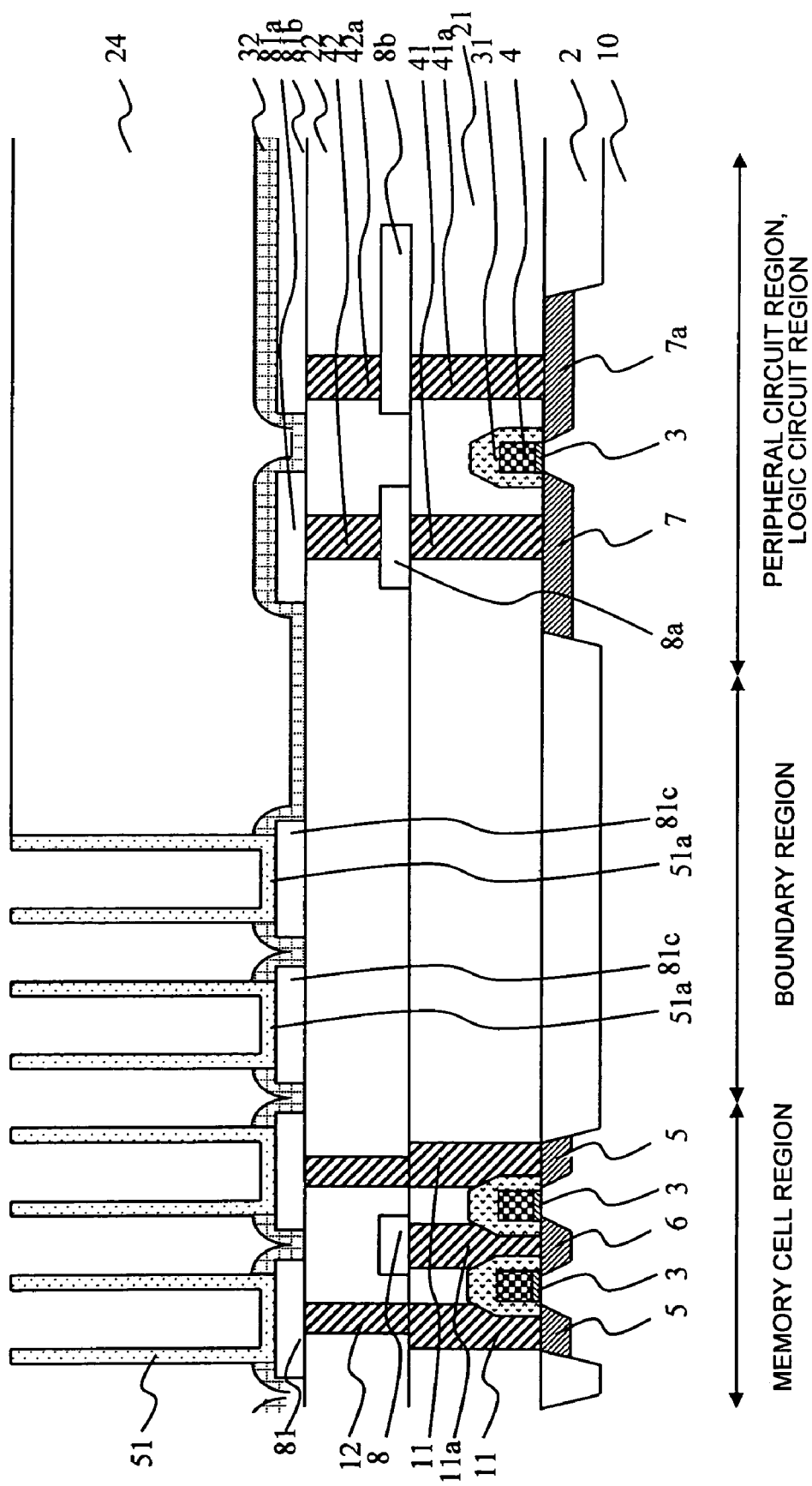
FIG. 29 is still another schematic view illustrating one step of a method for manufacturing the related semiconductor device.
Figure 30:
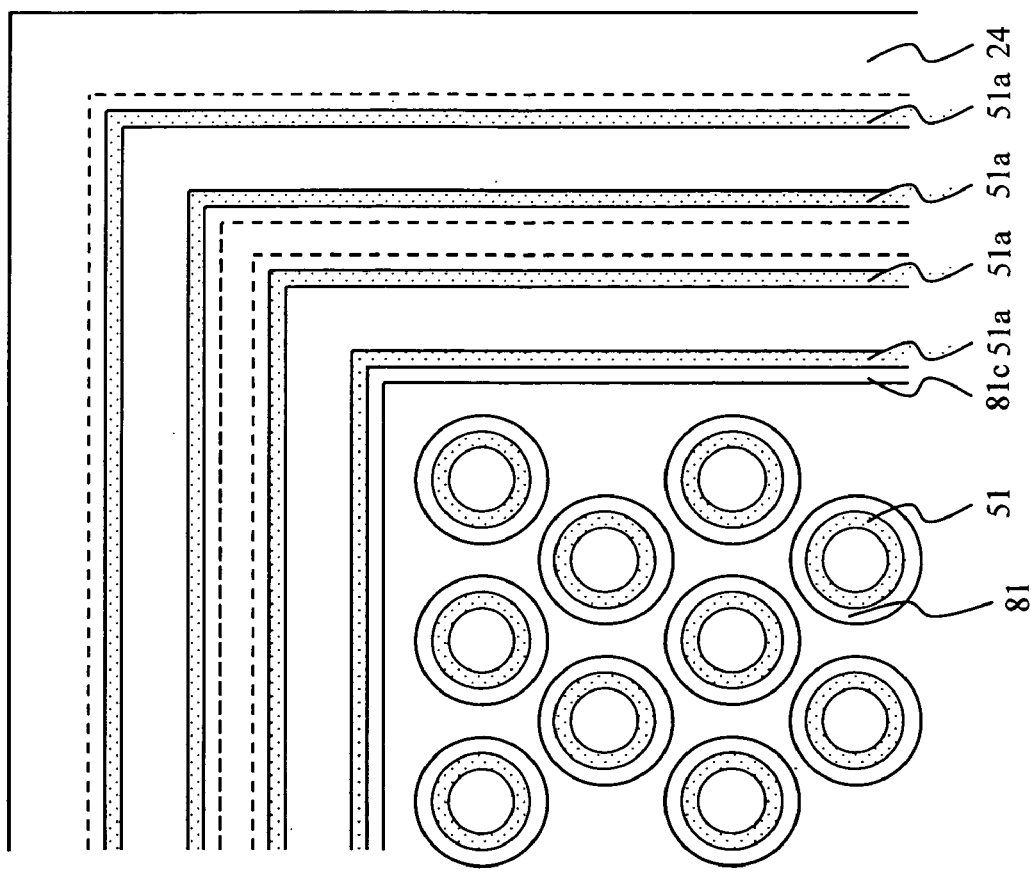
FIG. 30 is still another schematic view illustrating one step of a method for manufacturing the related semiconductor device.
Figure 31:
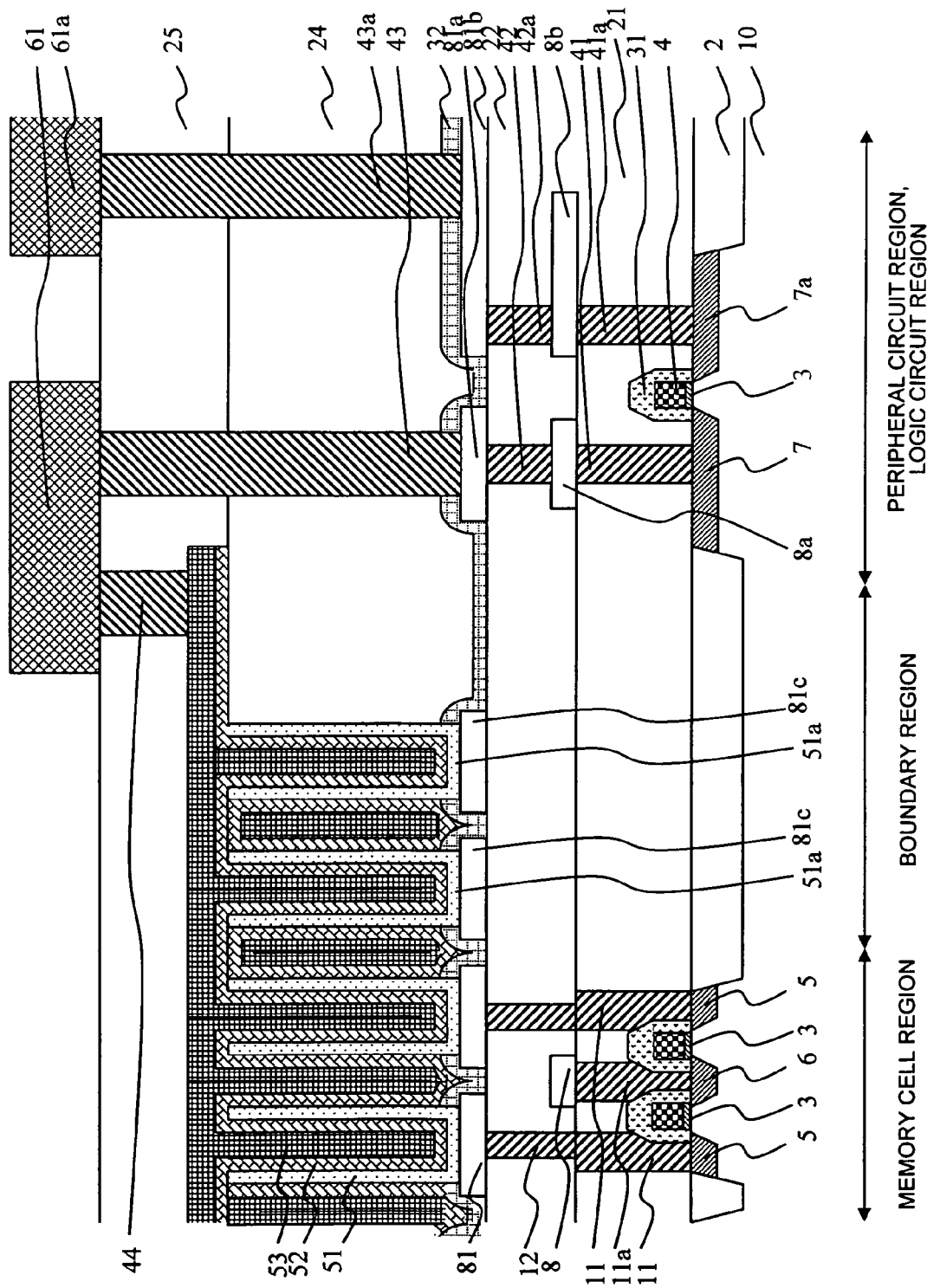
FIG. 31 is still another schematic view illustrating one step of a method for manufacturing the related semiconductor device.

Next, after creating contact holes within the interlayer insulating films 24, 25 and 32, a third titanium nitride film and a tungsten film were filled into the contact holes. After this, portions of the third titanium nitride film and the tungsten film external to the contact holes were removed using a CMP method to form metal plugs 43, 43a and 44 (second and third contact plugs) (FIG. 19). Subsequently, using a sputtering method, a titanium film, an aluminum film and a titanium nitride film were formed successively. Next, a laminated film composed of these films was subjected to patterning using a photolithographic technique and a dry etching technique, thereby forming second layer interconnects 61 and 61a (FIG. 1).

In the present exemplary embodiment, lower layer 81c, landing pad 81, lower conductive region 51a, lower electrode 51, anti-wet etching protective film 36a in the peripheral circuit region, and foundation layer 36 are formed simultaneously in one photolithography step and in one dry etching step. Consequently, the present exemplary embodiment has the advantage of being able to eliminate step differences between the memory cell region and the boundary region and between the memory cell region and the peripheral circuit (logic circuit) region without increasing the number of steps necessary in particular to alleviate a step difference between the memory cell region and the peripheral circuit region.

It should be noted that in the exemplary embodiment described heretofore, alterations may be made to aspects of a manufacturing method, an interconnect structure, and the like other than those characteristic of the present invention.

The semiconductor device of the present invention can be used as a memory cell or the like for a DRAM (Dynamic Random Access Memory).

It is apparent that the present invention is not limited to the above embodiments, but may be modified and changed without departing from the scope and spirit of the invention.

What is claimed is:

1. A semiconductor device, comprising:
   a memory cell region;
   a peripheral circuit region;
   a boundary region formed in a boundary between the memory cell region and the peripheral circuit region; and
   an interlayer insulating film formed across the peripheral circuit region and the boundary region,
   wherein the memory cell region comprises:
     a concave lower electrode formed so as to extend upwardly from below plane-A having level equal to an upper surface of the interlayer insulating film and protruding by a height of H above the plane-A; and
   a foundation layer having a thickness of H formed at least in part on the plane-A other than the part thereof taken up by the lower electrode, the boundary region comprises:
     one concave lower conductive region formed so as to extend upwardly from below plane-A having level equal to the upper surface of the interlayer insulating film and protruding by a height of H above the plane-A; and
     the foundation layer having a thickness of H formed on the upper surface of the interlayer insulating film, and
   the memory cell region and the boundary region comprise:
     a dielectric film formed so as to cover surfaces of the lower electrode, the lower conductive region and the foundation layer; and
     an upper conductive region including a conductive layer formed so as to have contact with an uppermost surface of a portion of the dielectric film over the plane-A and the interlayer insulating film, and a convex portion branching off from the conductive layer and disposed facing to the lower electrode and the lower conductive region with an intervention of the dielectric film therebetween.

2. The semiconductor device according to claim 1, wherein in the memory cell region, the concave lower electrode, the dielectric film covering the concave lower electrode, and the convex portion of the upper conductive region constitute a capacitor.

3. The semiconductor device according to claim 2, wherein the memory cell region includes at least two capacitors adjacent to each other, and further includes at least two field-effect transistors sharing a first impurity-diffused region and comprising independent second impurity-diffused regions, and
each of the second impurity-diffused regions of the field-effect transistors is electrically connected to the capacitor through a first contact plug.

4. The semiconductor device according to claim 1, wherein the boundary region further comprises a second contact plug electrically connected to the conductive layer of the upper conductive region,
the peripheral circuit region further comprises:
  a field-effect transistor; and
  two third contact plugs electrically connected to a third impurity-diffused region and a fourth impurity-diffused region of the field-effect transistor, and
  the second contact plug and at least one of the third contact plugs are electrically connected to each other through an interconnect layer.

5. The semiconductor device according to claim 1, wherein the H is 50 nm to 200 nm.

6. The semiconductor device according to claim 1, wherein a height of the lower electrode is 0.5 μm to 4 μm.

7. A semiconductor device, comprising:
   a memory cell region comprising:
     a first capacitor with a crown structure;
     a second capacitor with a crown structure having the same uppermost surface as the first capacitor; and
     a first foundation layer formed between the first capacitor and the second capacitor so as to have the same uppermost surface as the first and second capacitors,
   a peripheral circuit region formed surrounding the memory cell region, and
a boundary region formed between the memory cell region and the peripheral circuit region, comprising:
     a dummy capacitor disposed so as to surround the memory cell region, and formed so as to have the same uppermost surface as the first and second capacitors; and
     a second foundation layer formed between the capacitor positioned in a boundary region side among the first and the second capacitors and the dummy capacitor, so as to have the same uppermost level as the first and second capacitors.

8. The semiconductor device according to claim 7, wherein the memory cell region further comprises:
a third capacitor with a crown structure;
two field-effect transistors sharing a first impurity-diffused region and comprising independent second impurity-diffused regions; and
a first contact plug electrically connecting each of the second impurity-diffused regions of the field-effect transistors with the second and the third capacitors.

9. The semiconductor device according to claim 7, wherein the boundary region further comprises a second contact plug electrically connected to the dummy capacitor,
the peripheral circuit region further comprises:
  a field-effect transistor; and two third contact plugs electrically connected to a third impurity-diffused region and a fourth impurity-diffused region of the field-effect transistor, and the second contact plug and at least one of the third contact plugs are electrically connected to each other through an interconnect layer.

10. The semiconductor device according to claim 7, wherein a thickness of the first and the second foundation layers is 50 nm to 200 nm.

11. The semiconductor device according to claim 7, wherein a height of the dummy capacitor is 0.5 μm to 4 μm.

12. A semiconductor device comprising:
a memory cell region;
a peripheral region; and
a boundary region between the memory cell region and the peripheral region,
the memory cell region including:
   a plurality of cell capacitors; and
   a foundation layer coupling the cell capacitors to one another at an uppermost portion of lower electrodes of the cell capacitors and including a plurality of holes, the foundation layer being elongated to form an elongated portion over the boundary region.

13. The semiconductor device according to claim 12, wherein the boundary region comprises a dummy capacitor, the dummy capacitor being coupled to the cell capacitors via the elongated portion of the foundation layer.

14. The semiconductor device according to claim 12, wherein the memory cell region further includes:
at least two cell capacitors adjacent to each other;
two field-effect transistors sharing a first impurity diffused region and comprising independent second impurity diffused regions; and
a first contact plug electrically connecting each of the second impurity-diffused regions of the field-effect transistors with the cell capacitors.

15. The semiconductor device according to claim 13, wherein the boundary region further comprises a second contact plug electrically connected to the dummy capacitor,
the peripheral circuit region comprises:
   a field-effect transistor; and
   two third contact plugs electrically connected to a third impurity-diffused region and a fourth impurity-diffused region of the field-effect transistor, and the second contact plug and at least one of the third contact plugs are electrically connected to each other through an interconnect layer.

16. The semiconductor device according to claim 12, wherein the thickness of the foundation layer is 50 nm to 200 nm.

17. The semiconductor device according to claim 13, wherein a height of the dummy capacitor is 0.5 μm to 4 μm.

* * * * *